(12) United States Patent
Nomura et al.

(10) Patent No.: US 7,870,665 B2
(45) Date of Patent: Jan. 18, 2011

(54) METHOD OF MANUFACTURING A CONDUCTOR CIRCUIT, AND A COIL SHEET AND LAMINATED COIL

(75) Inventors: Toshihiro Nomura, Ibi-gun (JP); Naotaka Higuchi, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/351,229

(22) Filed: Jan. 9, 2009

(65) Prior Publication Data
US 2009/0243781 A1 Oct. 1, 2009

Related U.S. Application Data

(60) Provisional application No. 61/040,241, filed on Mar. 28, 2008.

(51) Int. Cl.
- H05K 3/02 (2006.01)
- H01R 43/00 (2006.01)
- H05K 3/10 (2006.01)
- H05K 3/00 (2006.01)
- H01F 5/00 (2006.01)

(52) U.S. Cl. ............... 29/847; 29/825; 29/846; 29/850; 427/96.1; 205/125; 336/200

(58) Field of Classification Search ........ 29/825, 29/846, 847, 850, 854, 857, 868; 427/96.1; 205/125; 336/200
See application file for complete search history.

(56) References Cited

U.S. PATENT DOCUMENTS

| 6,018,298 | A   | * | 1/2000  | Endo et al. .......... 340/572.5 |
| 6,343,744 | B1  | * | 2/2002  | Shibata et al. .......... 235/492 |
| 6,476,775 | B1  | * | 11/2002 | Oberle .......... 343/895 |
| 6,625,032 | B1  | * | 9/2003  | Ito et al. .......... 361/751 |
| 6,675,470 | B2  | * | 1/2004  | Muramatsu .......... 29/832 |
| 2004/0231138 | A1 | * | 11/2004 | Kasahara et al. .......... 29/602.1 |

FOREIGN PATENT DOCUMENTS

JP       07-142254       6/1995

* cited by examiner

*Primary Examiner*—Elvin G Enad
*Assistant Examiner*—Tszfung Chan
(74) *Attorney, Agent, or Firm*—Oblon, Spivak, McClelland, Maier & Neustadt, L.L.P.

(57) ABSTRACT

A conductor circuit and method of manufacturing a conductor circuit. The method includes forming a continuous conductor pattern on an insulating substrate, and connecting a short-circuit wire at a first position on the continuous conductor pattern such that two or more points on the continuous conductor pattern are short-circuited to each other by the short-circuit wire at the first position. An electrolytic plating film is formed on the continuous conductor pattern while the short-circuit wire is connected to the continuous conductor pattern at the first position, and the short-circuit wire is removed from the first position on the continuous conductor pattern to uncover a first exposed portion of the continuous conductor pattern.

11 Claims, 22 Drawing Sheets

FIG. 5
(a)
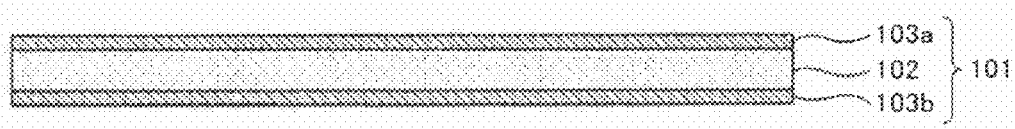
(b)
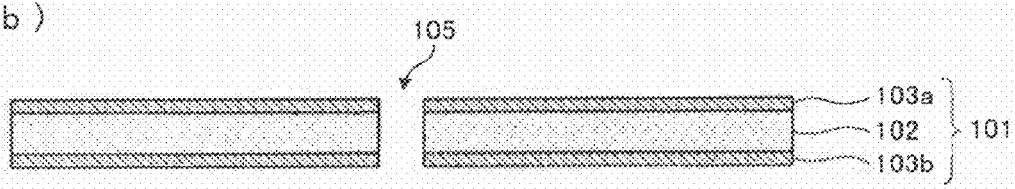
(c)
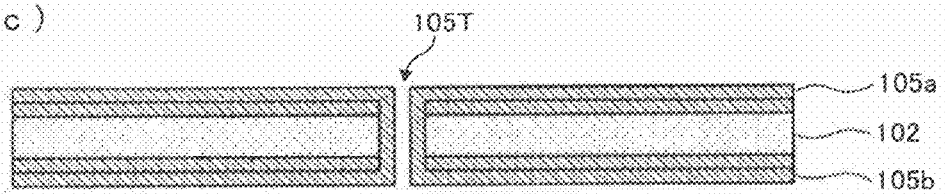

FIG. 8
(a)
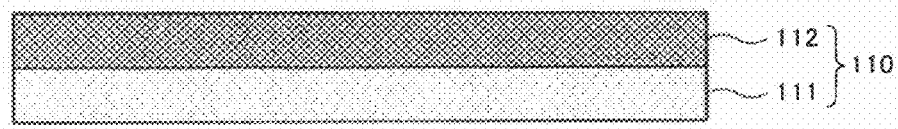
(b)
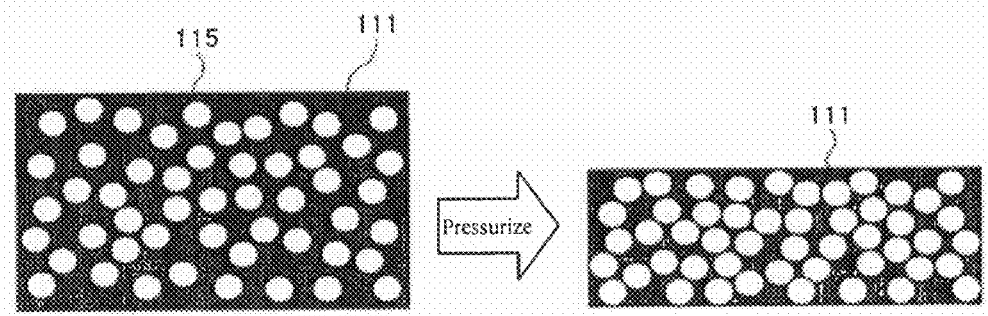

FIG. 11
(a)
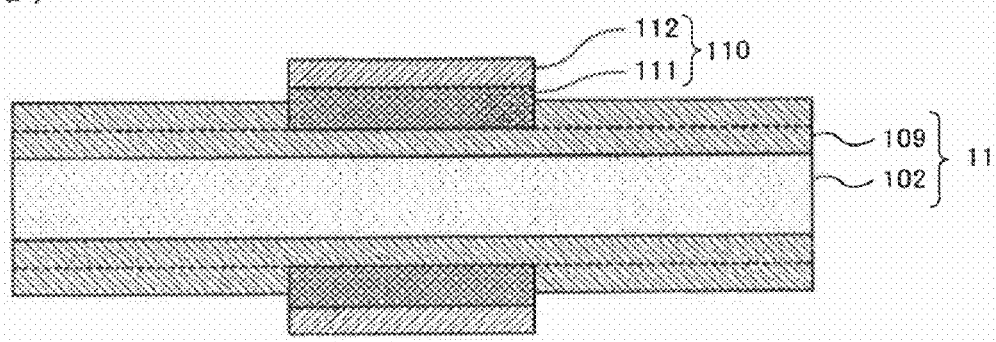
(b)
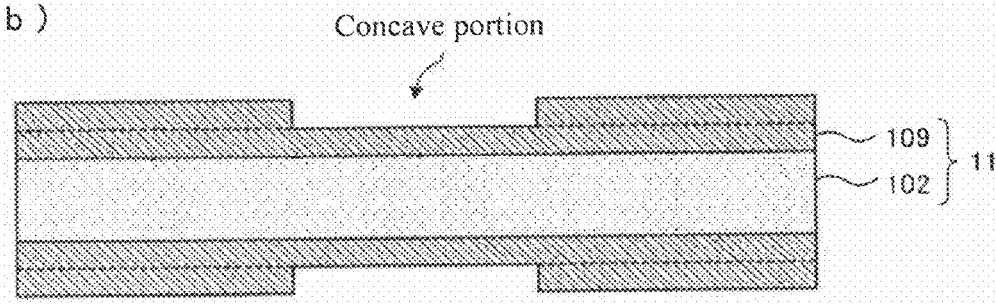

FIG. 18
(a)
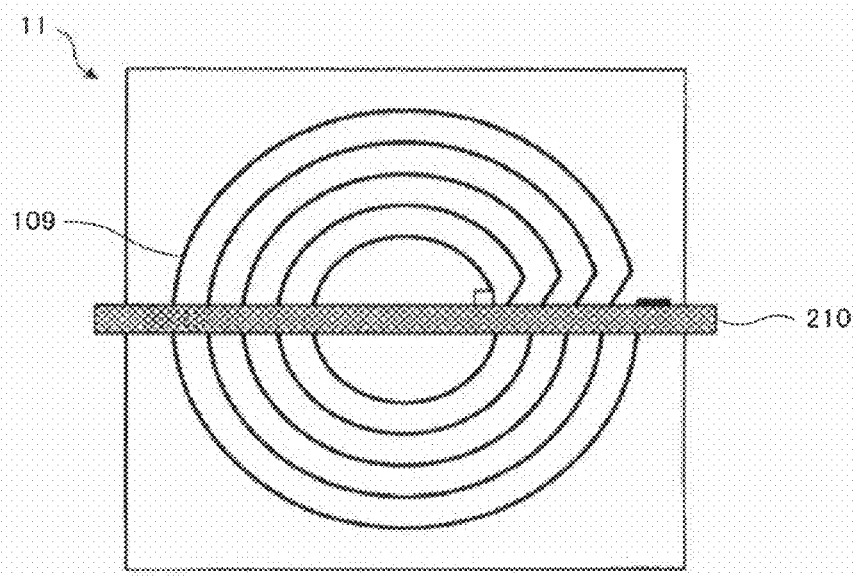
(b)
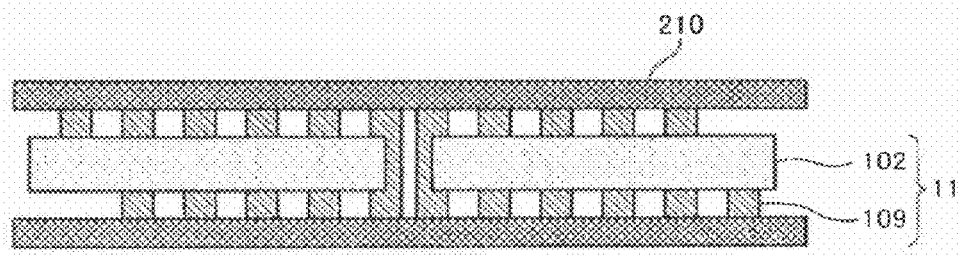

FIG. 19
(a)
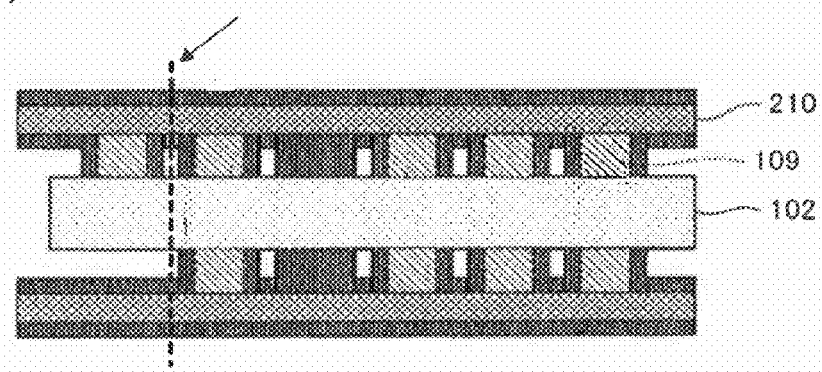
(b)
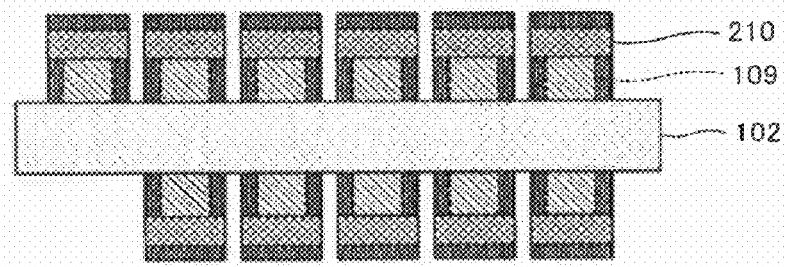
(c)
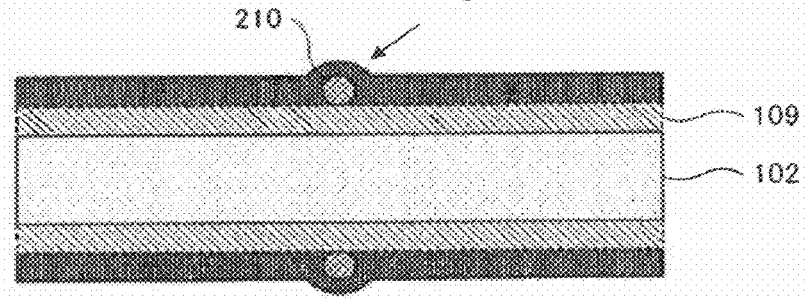

Connection pattern

METHOD OF MANUFACTURING A CONDUCTOR CIRCUIT, AND A COIL SHEET AND LAMINATED COIL

CROSS-REFERENCE TO RELATED APPLICATIONS

The present application claims the benefits of priority to U.S. Application No. 61/040,241, filed Mar. 28, 2008. The contents of that application are incorporated herein by reference in their entirety.

BACKGROUND OF THE INVENTION

1. Technical Field

The present invention relates to methods of manufacturing a conductor circuit such as a printed coil used, for example, for a sensor coil and a motor coil, and particularly relates to a method of manufacturing a conductor circuit in which a coil with a higher space factor that shows the ratio of a conductor to the cross-section of a coil is formed.

2. Discussion of the Background

Conventionally, many techniques have been suggested for inexpensively realizing a printed coil with a uniform quality. As a technique disclosed in a bulletin, for example, Japanese Patent Laid-Open No. 07-142254 Bulletin discloses a technique of a printed coil in which a coil pattern formed via a printed circuit technique is provided on an insulating substrate and an electroplating layer is provided on the coil pattern by electroplating to strengthen the conductor of the coil pattern. The entire content of this publication is incorporated herein by reference

BRIEF SUMMARY OF EMBODIMENTS OF THE INVENTION

One aspect of the invention includes a method of manufacturing a conductor circuit. The method includes forming a continuous conductor pattern on an insulating substrate, and connecting a short-circuit wire at a first position on the continuous conductor pattern such that two or more points on the continuous conductor pattern are short-circuited to each other by the short-circuit wire at the first position. An electrolytic plating film is formed on the continuous conductor pattern while the short-circuit wire is connected to the continuous conductor pattern at the first position, and the short-circuit wire is removed from the first position on the continuous conductor pattern to uncover a first exposed portion of the of the continuous conductor pattern.

Another aspect of the invention includes a coil sheet having an insulating layer with a first surface and a second surface opposed to the first surface. A first coil pattern is formed on the first surface of the insulating layer, a second coil pattern formed on the second surface of the insulating layer; and a through-hole conductor passes through the insulating layer and connects the first coil pattern to the second coil pattern. An electrolytic plating film is formed on at least one of the first and second coil patterns such that a thickness of the electrolytic plating film is substantially uniform across an entire area of the coil pattern to which the plating film is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is an explanatory drawing illustrating a process of manufacturing a coil sheet shown in FIG. 3.

FIG. 8 is an explanatory diagram of an example of a short-circuit wire.

FIG. 11 is an explanatory drawing illustrating the state where a short-circuit wire is removed from a coil pattern.

FIG. 18 is an explanatory diagram illustrating the state where short-circuit wire is connected to a coil sheet according to the second embodiment.

FIG. 19 is an explanatory diagram illustrating the state where a short-circuit wire is removed from a coil pattern according to the second embodiment.

DETAILED DESCRIPTION OF THE PREFERRED EMBODIMENTS

Figure 1:
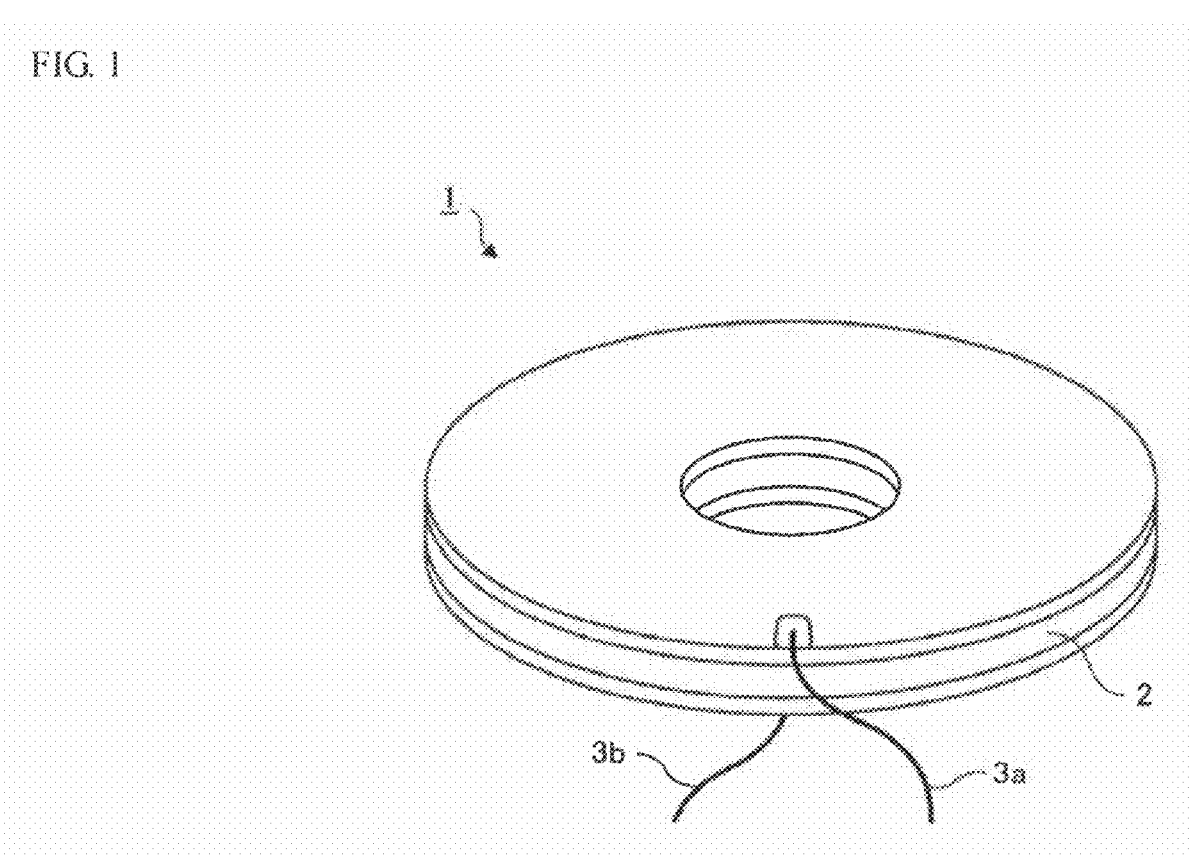
FIG. 1 is an external perspective view of a laminated coil according to the first embodiment.

As The performance of a coil is indicated by the product (ampere-turn) of electric current and the winding number. The higher the space factor—that is, the larger the winding number per unit cross-section—the higher can be the increase in ampere-turn per unit cross-section. However, in the case of an extremely long conductor circuit with, for example, several meters to several tens of meters, such as a planar coil, of electrical resistance in the conductor when a potential is applied thereon in plating is not negligible. Thus, it is difficult to realize uniform plating thickness over the entire conductor. Therefore, the formation of a laminated coil having a higher space factor has been difficult.

One object of the present invention is to provide a method of manufacturing a conductor circuit in which the variation in plating thickness over the entire conductor is restrained. In addition, an object is to provide a coil sheet and a laminated coil with a higher space factor.

To solve the abovementioned problems, the method of manufacturing a conductor circuit according to the present invention comprises: a short-circuit wire-connecting process in which a conductor pattern formed on an insulating substrate is connected by a short-circuit line including at least one conductive material; a plating process in which a plating layer is formed; and a process of removing short-circuit wires in which the short-circuit wire is removed from the conductive pattern.

To solve the abovementioned problems in the laminated coil according to the present invention, a plurality of coil sheets on which a coil pattern is formed as a conductor circuit is formed on an insulating resin substrate, and the plurality of coil sheets are deviated and laminated so that a concave portion or a convex portion formed on the surface of the coil pattern is not overlapped when electrolytic plating is applied by connecting a conductor pattern with a short-circuit wire so as to be a uniform potential over the coil pattern.

According to the present invention, the method of manufacturing a conductor circuit in which a conductor circuit with a uniform film thickness and line width from the starting end to the terminal end of the conductor circuit can be formed. In addition, a coil sheet and a laminated coil with a higher space factor can be provided.

The embodiments will now be described with reference to the accompanying drawings, wherein like reference numerals designate corresponding or identical elements throughout the various drawings. Hereinafter, embodiments that implement the present invention will be explained in detail.

First Embodiment

Figure 2:
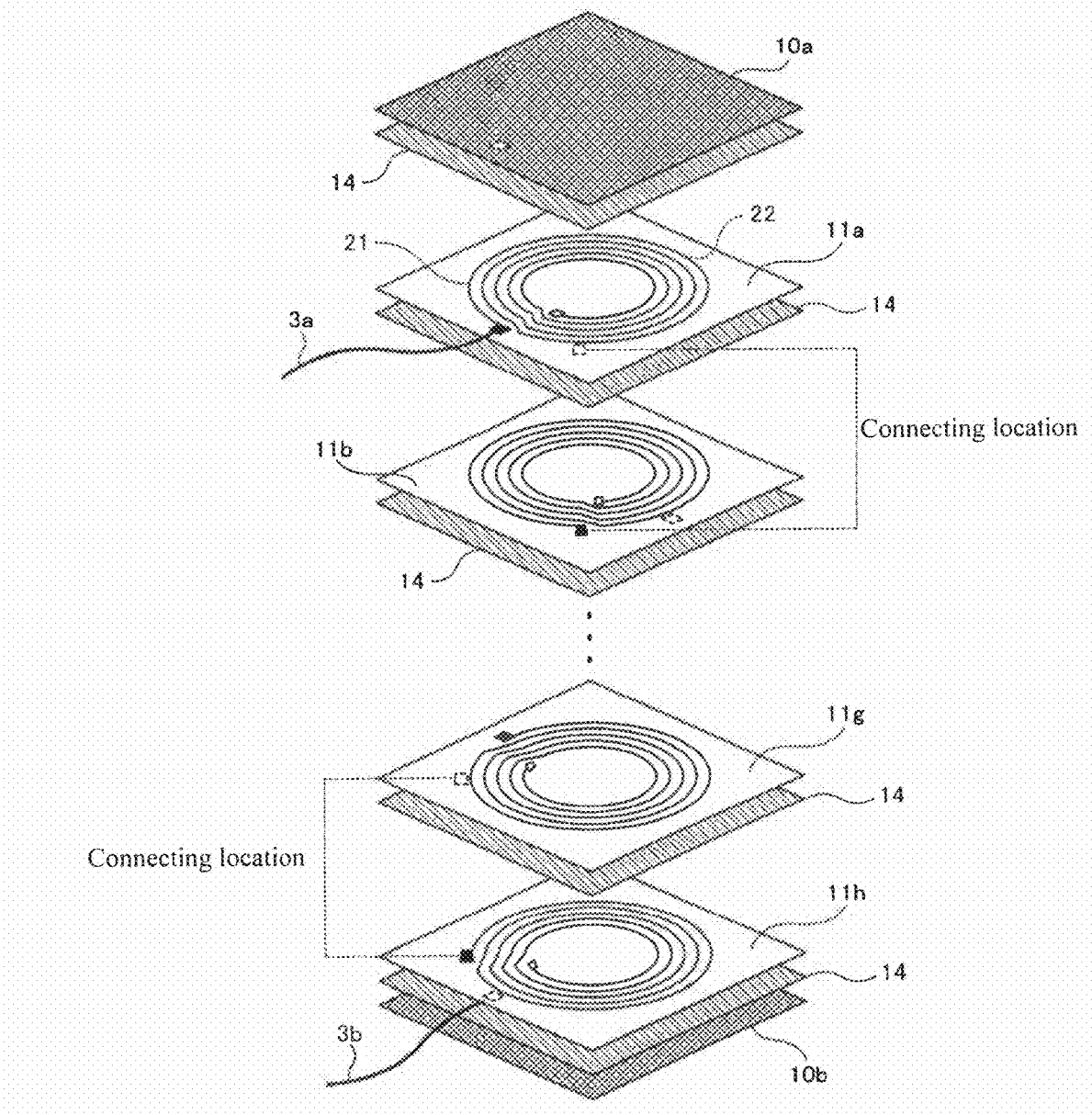
FIG. 2 is an exploded perspective view to describe the structure of the laminated coil shown in FIG. 1.

FIG. 1 is an external perspective view of a laminated coil 1 according to the first embodiment, and FIG. 2 is an exploded perspective view for describing the structure of the laminated coil 1 shown in FIG. 1.

As shown in FIG. 1, the laminated coil 1 comprises a laminated coil body 2 and connecting cords 3a and 3b that are connected to the front and back surfaces of the laminated coil body 2 for supplying power to the coil.

As shown in FIG. 2, the laminated coil body 2 comprises coil sheets 11a to 11h (hereafter, "11" may be used for the purpose of explanation) described below, radiator plates 10a and 10b, and an insulating sheet 14. The radiator plates 10a and 10b are attached to the outermost of the laminated coil body 2 in order to radiate the heat generated when the coil sheet 11 applies current. In addition, the insulating sheet 14 is provided between the coil sheets 11, in addition to between the coil sheet 11 and the radiator plates 10a and 10b. After laminating each coil sheet 11, the insulating sheet 14, and the radiator plates 10a and 10b, the laminated coil 1 shown in FIG. 1 is formed by cutting with a tool such as a cutter, a laser, or the like. However, in the first embodiment, although the explanation is given with reference to a circular laminated coil as an example in which eight coil sheets 11a to 11h are laminated, the present invention is not limited to such a number of sheets or shape of the coil sheet; for example, four or twelve sheets can be used. In addition, the shape may be circular, square, or trapezoidal.

Figure 3:
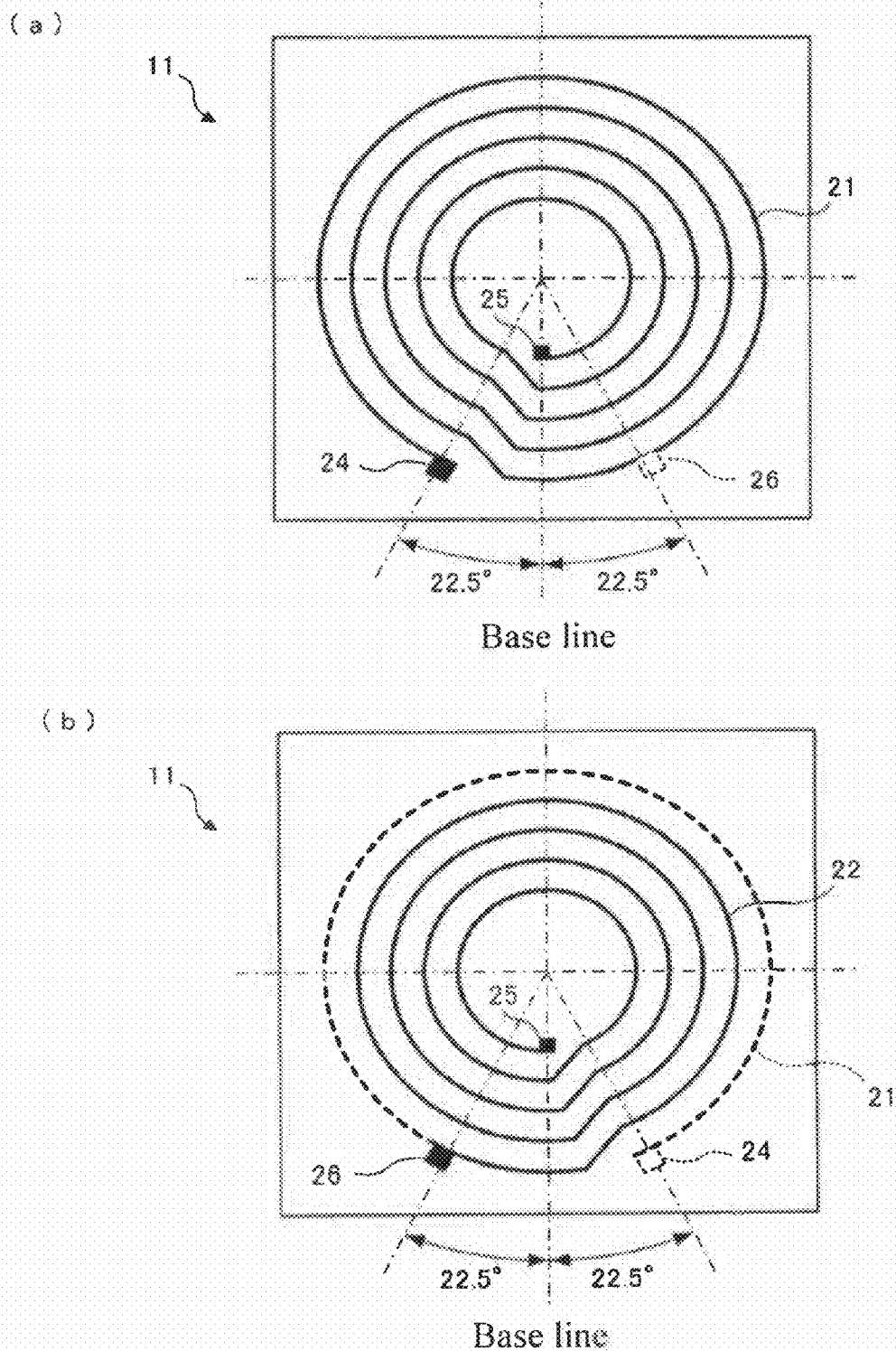
FIG. 3 is a plan view of the coil sheet of the laminated coil shown in FIG. 1.

For the coil sheets 11a to 11h, an insulating resin substrate 102 (see FIG. 5) is used as a base material, and coil patterns 21 and 22 made of metal such as copper and that are formed so as to be spiral in shape are provided on the coil sheets (see FIG. 3). The coil sheets 11a to 11h are placed and laminated so that the coil patterns 21 and 22 formed on each coil sheet 11 form a concentric circle. The outermost coil sheets 11a and 11h are provided with connecting terminals 24 and 26 that connect the connecting cords 3a and 3b.

The radiator plates 10a and 10b are composed of a sheet metal made of copper or the like. The radiator plates 10a and 10b sandwich the laminated coil sheets 11a to 11h and are attached to the outermost part of the laminated coil body 2. For the radiator plates 10a and 10b, clearance is formed at the connecting cords 3a and 3b portions, which are connected to the outermost coil sheets 11a and 11h.

Configuration of the coil sheet: The configuration of the coil sheet 11 will be described below.

FIG. 3(a) is a plan view illustrating a surface on which the coil pattern 21 of the coil sheet 11 on the laminated coil 1 shown in FIG. 1 are formed (hereafter, it may be referred to as "front surface"). FIG. 3(b) is a plan view illustrating a surface on which the coil pattern 22 of the coil sheet 11 is formed (hereafter, it may be referred to as "back surface"). As shown in FIG. 3, for the coil sheet 11, the spiral coil patterns 21 and 22 are formed on the front and back surfaces of the insulating resin substrate 102 (see FIG. 5) using a printed circuit technique. In FIG. 3(b), the coil pattern 22 on the back surface side is drawn with a solid line, while the coil pattern 21 on the front surface side is drawn with a dashed line.

For the coil sheet 11, a resin substrate with insulating properties—such as polyimide resin, polyamide resin, nylon resin, Teflon™ resin, or the like—is used as a base material. In addition, it is preferable for the resin substrate to have higher heat resistance. In consideration of strength, the winding number of the coil patterns 21 and 22 formed on the front and back surfaces, and the space factor after the formation of a conductor circuit, a resin substrate with a thickness of 0.02 mm to 0.1 mm is preferable for the base material of the coil sheet 11. Specifically, for example, when polyimide resin or the like is a base material, the thickness thereof is preferably about 0.025 mm.

The coil patterns 21 and 22 formed on the coil sheet 11 have a conductor pattern formed in a prescribed shape with, for example, a highly-pure copper film via an etching process or the like (described below). Specifically, for the coil pattern 21, as shown in FIG. 3(a) with a solid line, the connecting terminal 24 is formed on the outer peripheral side end thereof, and in the first embodiment, it is formed so as to spirally run clockwise from the outer periphery to the inner periphery. A through-hole with a diameter of about 0.3 mm is formed on the inner peripheral side end, and the inner wall of the through-hole is plated so as to form a through-hole conductor 25. The front and back surface coil patterns 21 and 22 are electrically connected through the through-hole 25.

The back surface coil pattern 22 is, as shown in FIG. 3(b) with a solid line, formed so as to spirally run counterclockwise from the outer periphery to the inner periphery (clockwise from the inner periphery to the outer periphery). Then, the connecting terminal 26 is formed on the outer peripheral side end.

As described above, the front surface side coil pattern 21 and the back surface side coil pattern 22 are electrically connected through the through-hole conductor 25 formed on the inner peripheral side end.

In addition, as viewed from the same surface, it is spirally wound in the same direction. Therefore, the front and back surface coil patterns 21 and 22 function as a coil that is electrically connected in series. However, the coil patterns 21 and 22 according to the first embodiment are, for example, formed with an outer diameter of 140 mm, an inner diameter of 90 mm, a line width of about 0.33 mm, and a line interval of 0.20 mm, and are wound about 50 times (the winding number or the like is simplified in FIG. 3 and others). The length per surface for the coil patterns 21 and 22 is about 18.5 m, so the total length of both surfaces is 37 m.

The connecting terminals 24 and 26 on the front and back surfaces of the coil sheet 11 are formed at the position where they have the same radius from the center point of the coil sheet 11. When a virtual base line connecting the center of the coil sheet 11 and the through-hole conductor 25 is provided, the connecting terminals 24 and 26 on the front and back surfaces 24 and 26 are formed at a position where the central angle with respect to the base line is 22.5 degrees. That is, two connecting terminals 24 and 26 are formed at a position that is line-symmetric with respect to the base line.

Because the connecting terminal 26 on the back surface side of the coil sheet 11 is formed at the position of 45 degrees with respect to the connecting terminal 24 on the front surface side, when the eight coil sheets 11a to 11h are laminated so that the connecting terminals on the opposing surfaces correspond to each other (described below), the connecting cords 3a and 3b connected to the outermost coil sheet 11a and 11h are connected at the same position two-dimensionally when viewing the laminated coil 1 from the front surface (360 degrees=45 degrees×8 sheets). However, the present invention is not specifically limited in the number of coil sheets, as the connecting cords 3a and 3b can be formed at the same position two-dimensionally, even if, for example, four or thirty coil sheets are laminated. For example, in the case of four coil sheets, the connecting terminal 26 on the back surface side of the coil sheet 11 can be formed at the position of 90 degrees in the central angle with respect to the connecting terminal 24 on the front surface side (360 degrees=90 degrees×4 sheets). Similarly, in the case of thirty coil sheets, the connecting terminal 26 on the back surface side of the coil sheet 11 can be formed at the position of 12 degrees in the central angle with respect to the connecting terminal 24 on the front surface side (360 degrees=12 degrees×30 sheets).

Method of manufacturing coil sheets: The method of manufacturing coil sheets 11 having the abovementioned configuration is described below.

Figure 4:
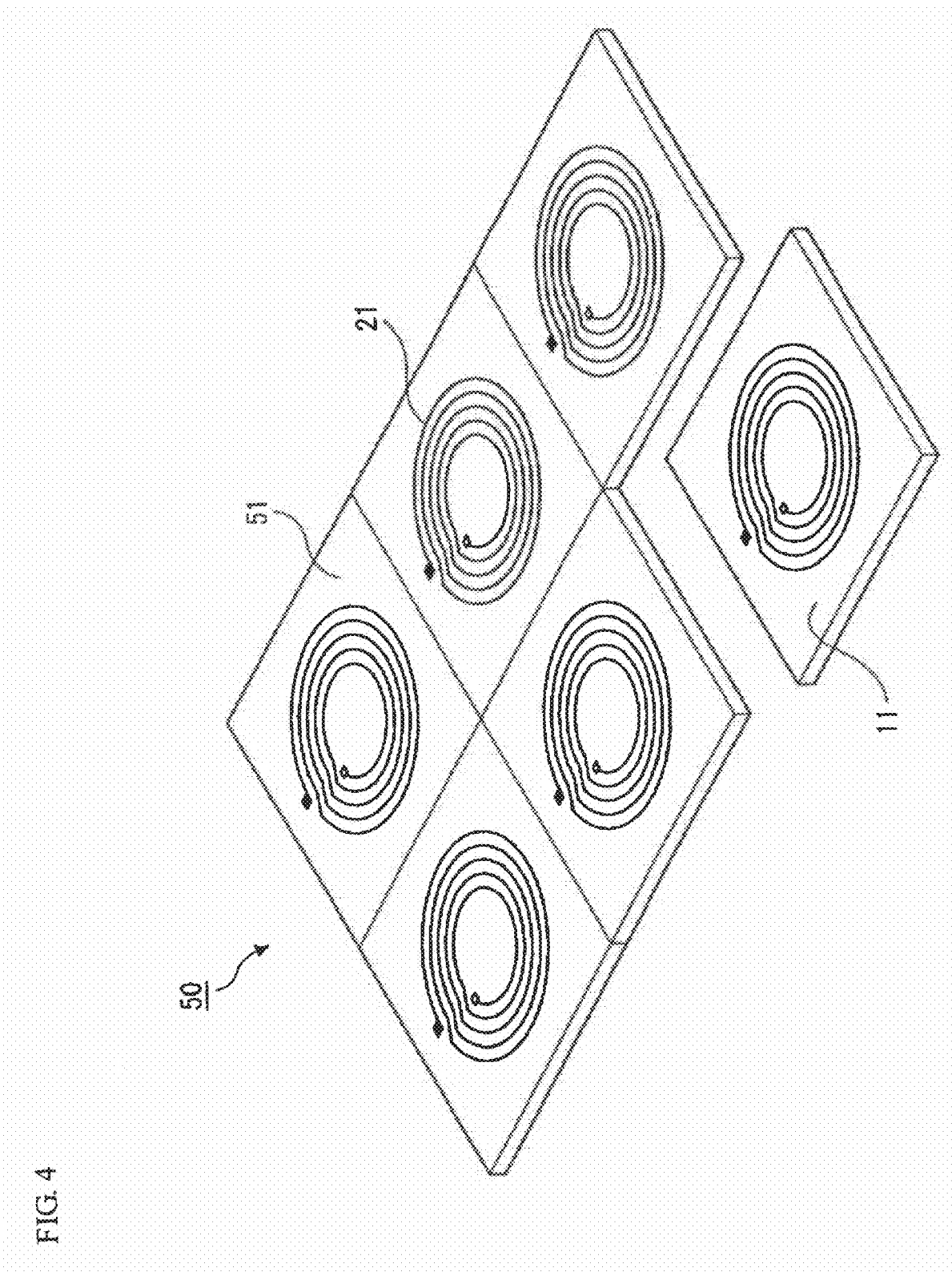
FIG. 4 is an explanatory drawing in a manufacturing state of a coil sheet.

FIG. 4 is an explanatory drawing of the procedure for manufacturing the coil sheet 11. As shown in FIG. 4, the coil patterns 21 and 22 are formed on the coil sheet 11 in a state in which a plurality of insulating resin substrates 102 (see FIG. 5) are arranged in the lengthwise and crosswise direction on the front and back surfaces using a printed circuit technique. Specifically, the coil patterns 21 and 22 are formed on the front and back surfaces of a substrate 50 through the manufacturing processes described below. Then, after forming a core 51 of the coil sheet 11, the coil sheet 11 is separated for every core 51 using a tool such as a cutter or a laser (not shown). In the following description, it is focused on one coil pattern 21 for describing the simplicity unless an illustration is especially required.

Figure 6:
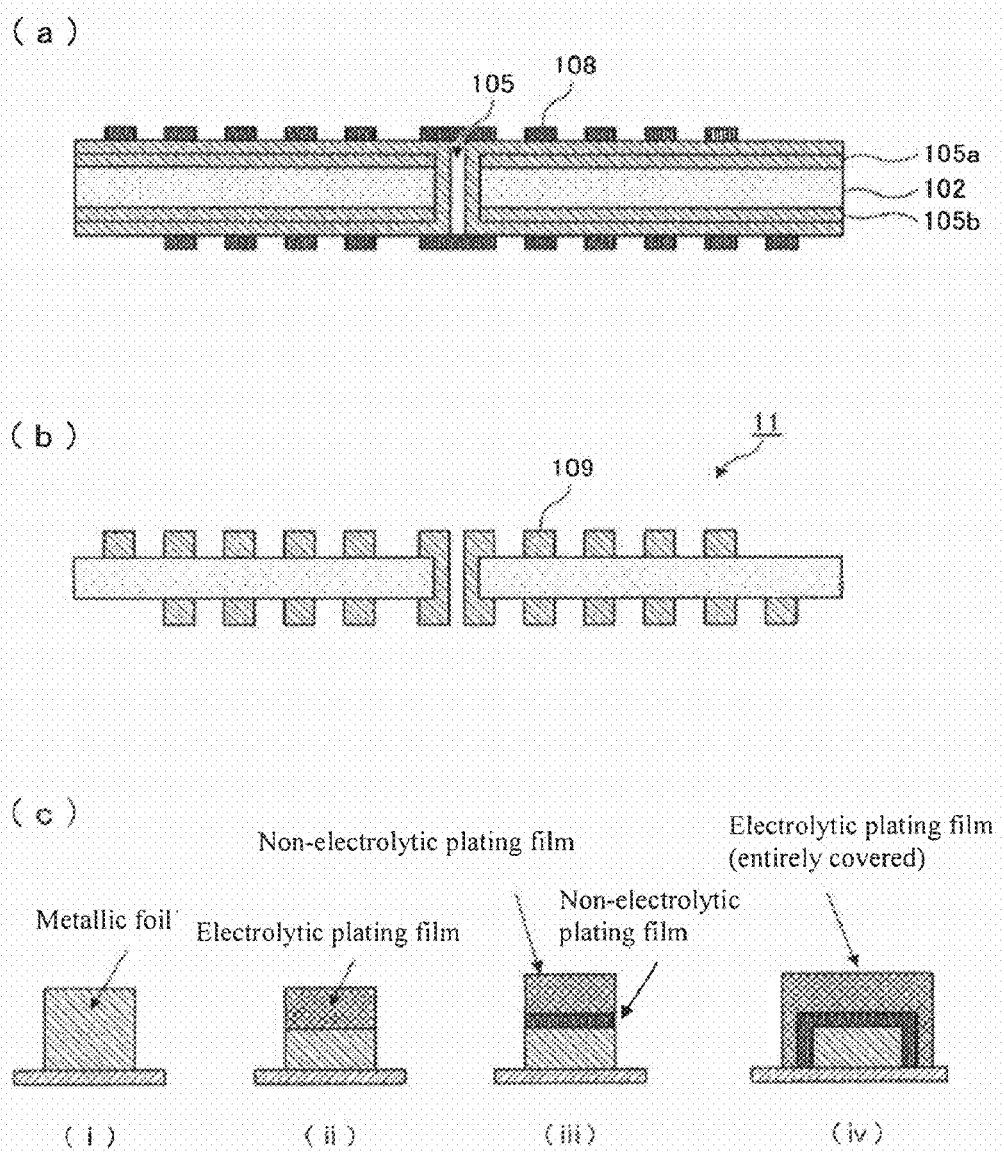
FIG. 6 is an explanatory drawing illustrating a process of manufacturing a coil sheet shown in FIG. 3.

FIG. 5 and FIG. 6 are explanatory drawings illustrating the process of manufacturing the coil sheet 11 shown in FIG. 3. As shown in FIG. 5(a), a starting material is a laminated plate 101 in which metallic films 103a and 103b are formed on both surfaces of the insulating resin substrate 102 made of polyimide resin or the like. The metallic film can include, for example, a metallic film, copper foil, nickel foil, or the like made of copper, nickel, cobalt, or the like. In the present embodiment, a double-sided copper-clad laminate 101 is used as the laminated plate 101, on which copper foil 103a and 103b is provided on both surfaces of the insulating resin substrate 102. Then, a through-hole 105 is formed at a prescribed position on the double-sided copper-clad laminate 101 using, for example, a drill or laser (CO2, UV) (see FIG. 5(b)) (through-hole forming process). The prescribed position can include, for example, the position of the inner peripheral side end of the coil pattern 21 (described below). The diameter of the through-hole 105 may, for example, be about 0.3 mm in diameter. However, although a double-sided copper-clad laminate 101 is used as a starting material in the first embodiment, the invention is not limited thereto. For example, a bonding process for bonding the copper foils 103a and 103b on both surfaces of the insulating resin substrate 102 may be provided, or a formation process for electrochemically forming the copper foils 103a and 103b may be provided. In the bonding process, a thickness of about 10 μm is necessary for the bonding layer.

Then, as shown in FIG. 5(c), a plating layer (copper plating layer) with a prescribed thickness is formed on the copper foils 103a and 103b through a non-electrolytic plating and an electrolytic plating process, and additional metallic films (copper thin film layers) 105a and 105b and a through-hole conductor 105T are formed thereon (non-electrolytic plating and electrolytic plating process, or thick copper forming process). For example, for the copper foils 103a and 103b with a thickness of 20 μm, the thickness of the additional metallic films 105a and 105b increases to a thickness of 100 μm. In this process, it makes the coil patterns 21 and 22 on the front and back surfaces electrically connectable by forming a copper plating layer on the inner peripheral surface of the through-hole 105 or by filling copper. However, the formation of additional metallic films 105a and 105b is not required. For example, when the double-sided copper-clad laminate 101 is used in which the thickness of the metallic film is 100 μm, this thick copper-forming process can be eliminated by electrically connecting the through-hole 105 in a later process.

As shown in FIG. 6(a), an etching resist 108 is formed on the built-up copper thin film layers 105a and 105b (etching resist forming process). A resist pattern of the etching resist 108 is formed on the copper thin film layers 105a and 105b in consideration of a prescribed shape as a coil pattern 109 (described blow, see FIG. 6(b)), line interval, line width, or the like. Patterning of a resist pattern is carried out by attaching a dry film to the copper thin film layers 105a and 105b formed by the thick copper forming process and by exposure and development, etching, and film peeling, which are normally carried out in the pattern formation of a printed wiring board. In this process, the etching resist 108 is formed so that the through-hole (through-hole conductor) 105 formed in the through-hole forming process is closed. It is prepared so that the copper plating layer already formed on the inner peripheral surface of the through-hole 105 is not etched in subsequent etching processes.

Then, etching is applied (etching process) as shown in FIG. 6(b). Specifically, the insulating resin substrate 102 on which the etching resist 108 (see FIG. 6(a)) is formed is soaked in an etchant solution to etch it by stirring for a predetermined time. In this process, the copper foils 103a and 103b and the copper thin film layers 105a and 105b, which are in a place where the etching resist is not applied, are etched and removed. Thereby, a coil-shaped coil pattern (conductor pattern) 109 appears on the insulating resin substrate 102, and thus, the coil sheet 11 is formed.

Four examples of layer forming in a conductor pattern are shown in FIG. 6(c): (i) a layer composed of only a metallic foil; (ii) a layer on which an electrolytic plating film is formed on the upper layer of the metallic foil; (iii) a layer on which additional electrolytic plating film is formed on a non-electrolytic plating layer formed on the upper layer of the metallic foil; and (iv) a layer on which an electrolytic plating film is formed so as to cover the metallic foil and the non-electrolytic plating layer.

Figure 7:
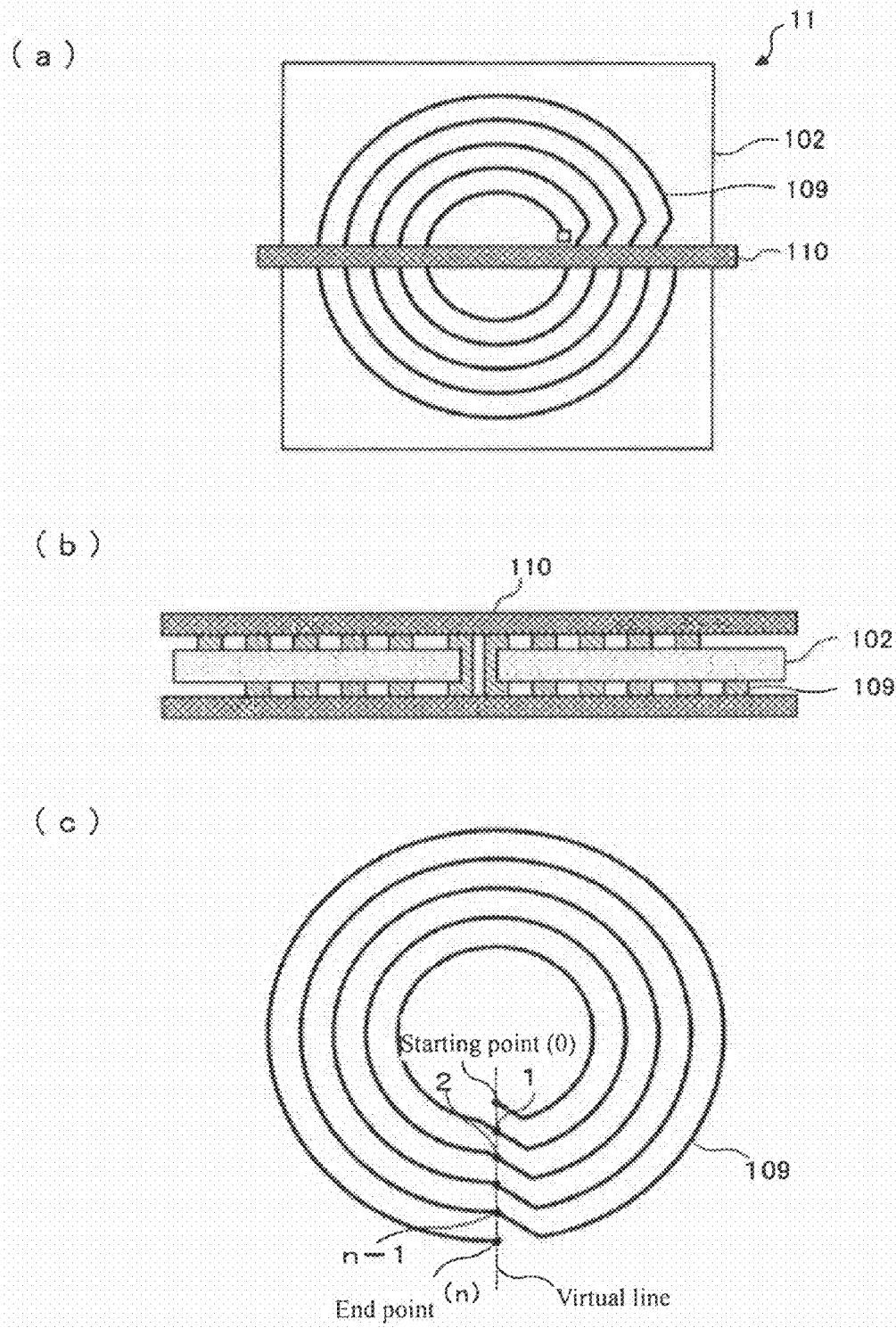
FIG. 7 is an explanatory drawing illustrating the state where a short-circuit wire is connected to a coil sheet.

FIG. 7 is an explanatory drawing illustrating the state wherein a short-circuit wire 110 is connected to the coil sheet 11.

Then, as shown in FIG. 7(a), a short-circuit wire 110 is connected to the formed coil pattern 109 (short-circuit wire-connecting process). Specifically, the short-circuit wire 110 is connected so as to cross the inner peripheral side and the outer peripheral side so that the conductor pattern of all turns of the coil pattern 109 are connected. In this process, as shown in FIG. 7(b), pressure is applied so that the short-circuit wire 110 is pressed to the insulating resin substrate 102 on which the coil pattern 109 is formed, as is described below.

As shown in FIG. 7(c), a straight line (virtual line) runs from the starting point to the end point of the coil pattern 109 and connecting the starting point to the end point thereof, where the starting point is zero. In this process, the portion (intersection) where the straight line (virtual line) and the coil pattern are primarily intersected is represented as 1, a portion (intersection) where they are secondarily intersected is represented as 2, and subsequent portions (intersections) are represented as 3, 4, . . . , and so on. Then, the portion (intersection) where they are finally intersected is represented as n−1, and the end point is represented as n. The portion of coil patterns from n−1 to n is an n-th turn coil pattern. That is, the coil pattern portion from the starting point (zero) to 1 is the first turn coil pattern, and the coil pattern portion from 1 to 2 is the second turn coil pattern portion (see FIG. 7(c)).

Next, the short-circuit wire 110 will be described.

FIG. 8 is an explanatory diagram of an example of the short-circuit wire 110. FIG. 8(a) shows a vertical cross-sectional view illustrating the configuration of the short-circuit wire 110, and FIG. 8(b) shows an explanatory diagram of the change in state inside an insulator (anisotropic conductive rubber) before and after pressurization.

As shown in FIG. 8(a), the short-circuit wire 110 comprises an insulator (anisotropic conductive rubber) 111 and a lead wire (plating lead) 112. The insulator 111 comprises a resin having elasticity and insulating properties and conductive particles 115. The conductive particles are dispersed throughout the resin. In the present embodiment, anisotropic conductive rubber (film) is used as an example of the insulator 111.

The lead wire 112 is attached to the anisotropic conductive rubber 111. The plating lead 112 is soaked in a plating bath with the substrate 50 (FIG. 10, described below) and the anisotropic conductive rubber 111 at the time of plating. Therefore, a metal that has a plating solution resistance or does not affect the plating process is preferable. In addition, it is preferable for the plating lead 112 to not be deformed when pressurized and to have a certain degree of cross-sectional area so as to thoroughly carry the potential applied at the time of plating (not as electrical resistance). However, the larger the cross-sectional area, the larger will be the obtained geometrical moment of inertia, so the stiffness can be increased.

Specifically, the base material of the anisotropic conductive rubber 111 may, for example, be a silicone resin, and gold-nickel alloy particles (Au/Ni particles) are dispersed therein as conductive particles 115.

As shown in FIG. 8(b), the anisotropic conductive rubber 111 provides conductivity as the conductive particles 115 therein contact each other by applying weight. However, if the pressure at the time of applying weight is too low, conductive particles 115 will not contact each other, and thus, conductivity cannot be provided. In contrast, if the pressure is too high, the insulating resin substrate 102 and the coil pattern 109 formed on the insulating resin substrate 102 (see FIG. 7(b)) may be inhibited and affected. Although the preferred pressure differs according to the elasticity of the anisotropic conductive rubber 111 and the proportion of content of conductive particles 115 therein, an anisotropic conductive rubber 111 is preferably selected that, for example, provides conductivity when about 300 to 350 g/cm2 of pressure is applied.

Figure 9:
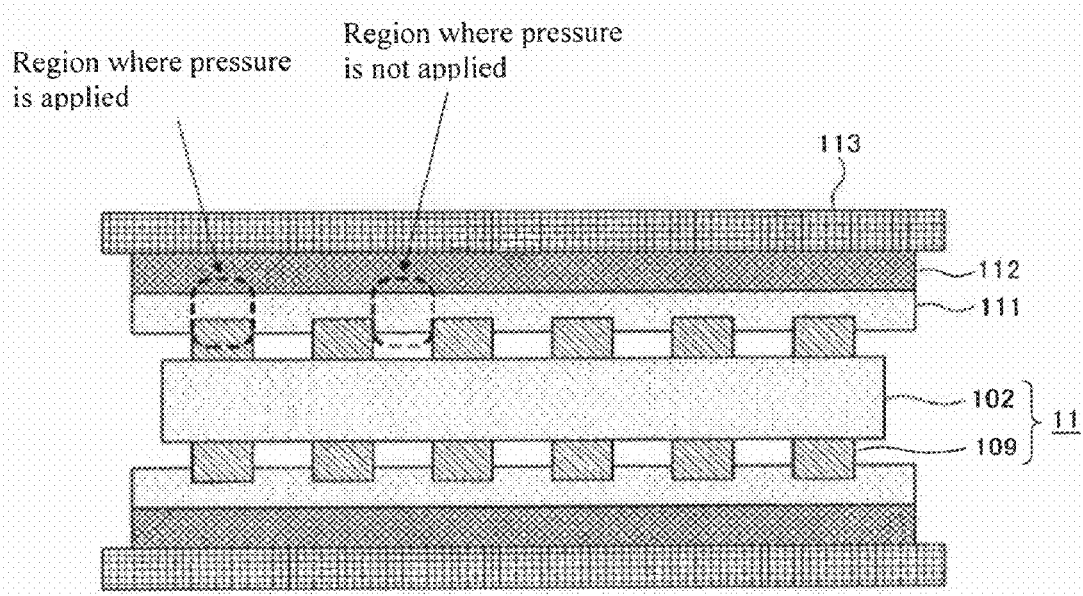
FIG. 9 is a diagram illustrating a state around a short-circuit wire at the time of pressurization.

FIG. 9 is a diagram illustrating the state around the short-circuit wire 110 at the time of pressurization. As shown in FIG. 9, the short-circuit wire 110 is connected to both surfaces of the insulating resin substrate 102 on which the coil pattern 109 is formed. Then, it is pressurized with an insulating plate 113 from the back surface of the short-circuit wire 110 to be pressed on the insulating resin substrate 102. The coil pattern 109 formed on the insulating resin substrate 102 is convexed with respect to the surface of the insulating resin substrate 102. Therefore, when the short-circuit wire 110 is pressed, the portion where the anisotropic conductive rubber 111 contacts the coil pattern 109 is pressurized, and potential forming the plating lead 112 is applied to the coil pattern 109. In contrast, the portion between the coil patterns 109 of the anisotropic conductive rubber 111 will not be a current-carrying state, because the pressure is not applied thereto.

Because the plating lead 112 of the short-circuit wire 110 has good current-carrying properties, the potential applied at the time of plating is maintained at nearly the same potential at any portion in the plating lead 112. In addition, because potential is applied to the coil pattern 109 via the anisotropic conductive rubber 111 from the plating lead 112, there is little potential difference at any portion in the coil pattern 109 and it is maintained at a prescribed potential. Therefore, a nearly uniform plating thickness can be realized at any portion on the coil pattern 109.

Because only the portion of the short-circuit wire 110 at which the coil pattern 109 is pressed carries current but the portion between the coil patterns 109 is not pressurized, the plating will not be formed on the portion between the coil patterns 109 of the anisotropic conductive rubber 111. Because the portion that is pressurized and to which a current is applied contacts the coil pattern 109 and does not directly contact a plating solution, plating will not be formed on that portion. Therefore, by using anisotropic conductive rubber 111, a copper plating layer can be formed efficiently on the coil pattern 109, despite the formation of little plating on the surface of the anisotropic conductive rubber 111.

Figure 10:
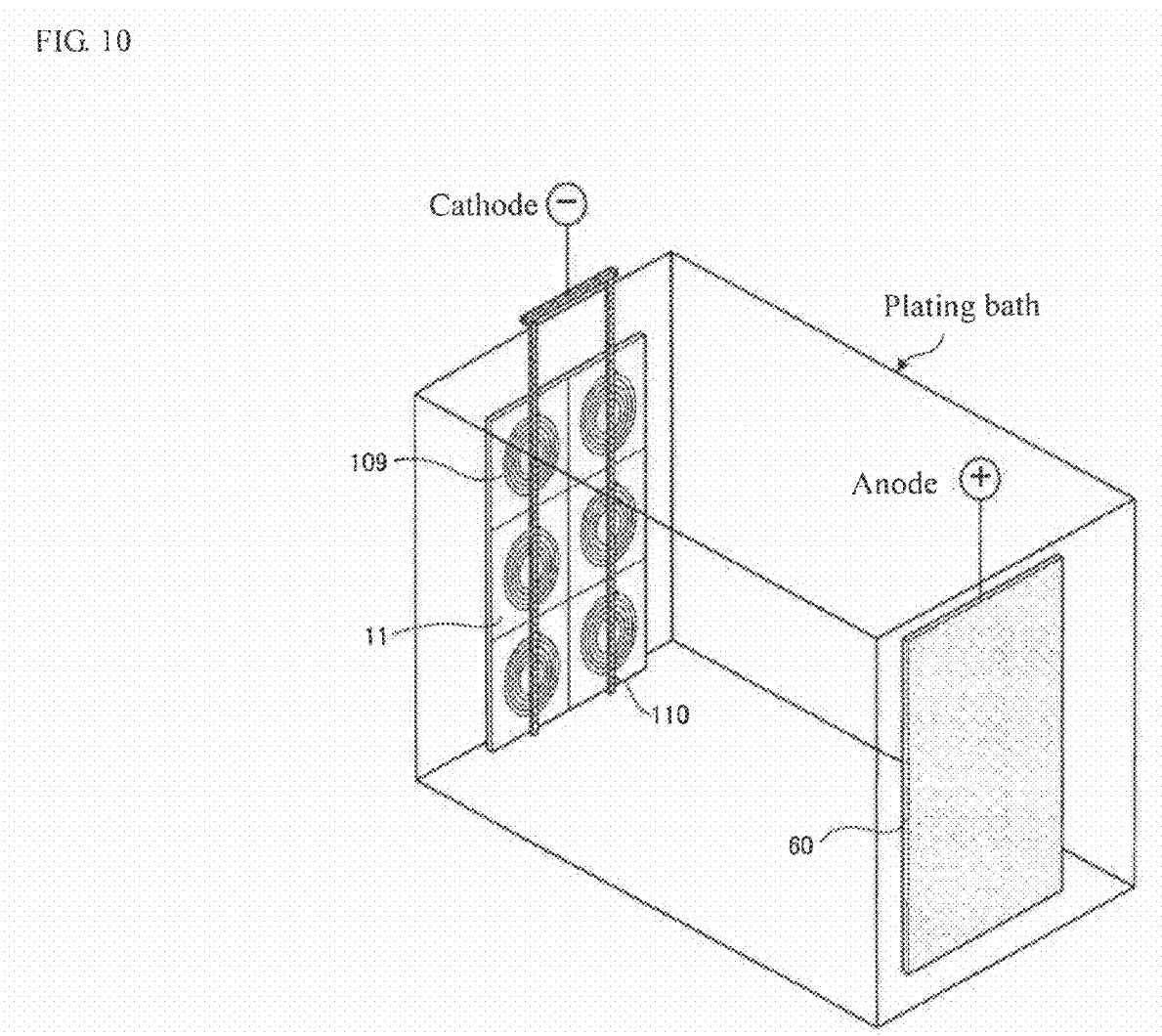
FIG. 10 is an explanatory drawing illustrating the state where a coil sheet is plated.

FIG. 10 is an explanatory drawing illustrating the state wherein a coil sheet 111 is plated. As shown in FIG. 10, the coil sheet 11 is soaked in a plating bath to plate (plating process) in the previous state in which the substrate 50 is cut into individual coil sheets 11. The coil sheet is soaked in the plating bath by connecting the substrate 50 on which the coil pattern (conductor pattern) 109 is formed on a cathode via the short-circuit wire 110 and by connecting the copper plate 60 that is the base material of the plating on an opposing anode. A plating solution can include a copper aqueous solution such as copper sulfate, for example. The plating is provided by applying a direct current for a predetermined time. However, the thickness of the copper plating layer may be controlled by adjusting the plating time and the magnitude of potential.

FIG. 11 is an explanatory drawing illustrating the state wherein the short-circuit wire 110 is removed from the coil pattern 109.

As shown in FIG. 11, upon completing the plating process, the short-circuit wire 110 is removed from the coil pattern 109 (process of removing short-circuit wires). Upon removing the short-circuit wire 110 after providing the plating in the state shown in FIG. 11(*a*), a copper plating layer is not formed on the portion of the coil pattern 109 that is in contact with the anisotropic conductive rubber 111 and a concave portion is formed. Because the cross-sectional area of the coil pattern 109 becomes smaller in the concave portion, the electrical resistance becomes larger when it is used by applying a current to the laminated coil (see FIG. 1), and it may generate heat. Therefore, in order to make the cross-sectional area of the coil pattern 109 uniform, the plating is repeated by displacing the portion that is in contact with the anisotropic conductive rubber 111 so as to form a more uniform cross-section.

Figure 12:
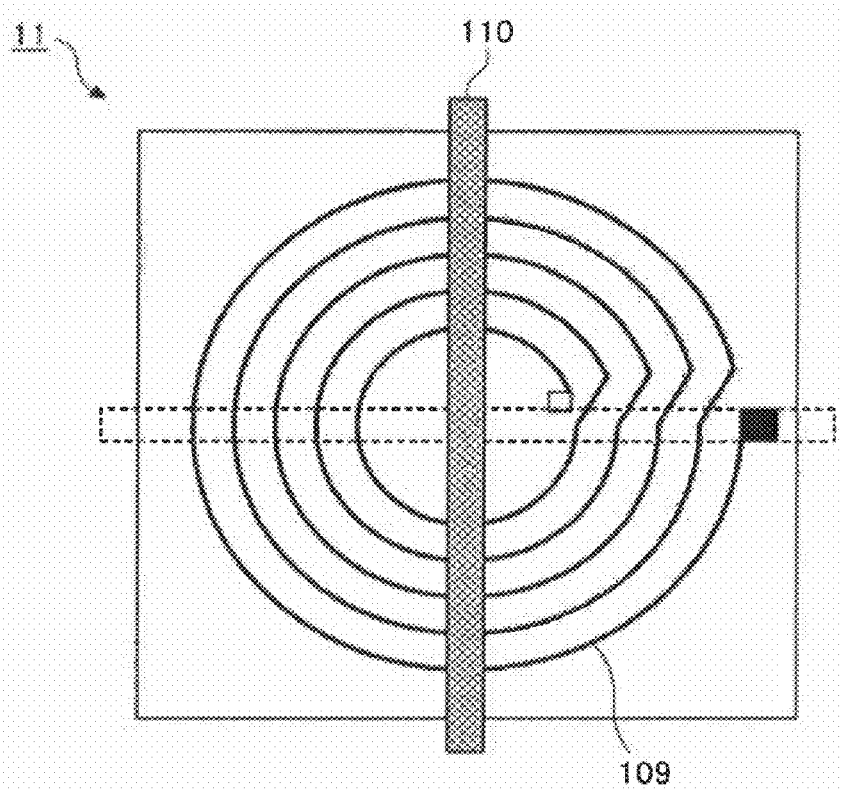
FIG. 12 is an explanatory diagram illustrating the state where a short-circuit wire is reconnected to a coil sheet.

FIG. 12 is an explanatory diagram illustrating the state in which the short-circuit wire 110 is reconnected to the coil sheet 11. As shown in FIG. 12, the short-circuit wire 110 is reconnected to a place that is different from the place to which the short-circuit wire 110 was previously connected (shown by a dashed line, see FIG. 7) (process of reconnecting short-circuit wires). Then, similar to the previous plating process, a re-plating process is provided for thickening the plating layer (re-plating process). Upon the completion of the re-plating process, the short-circuit wire 110 is removed (process of removing short-circuit wires).

Figure 13:
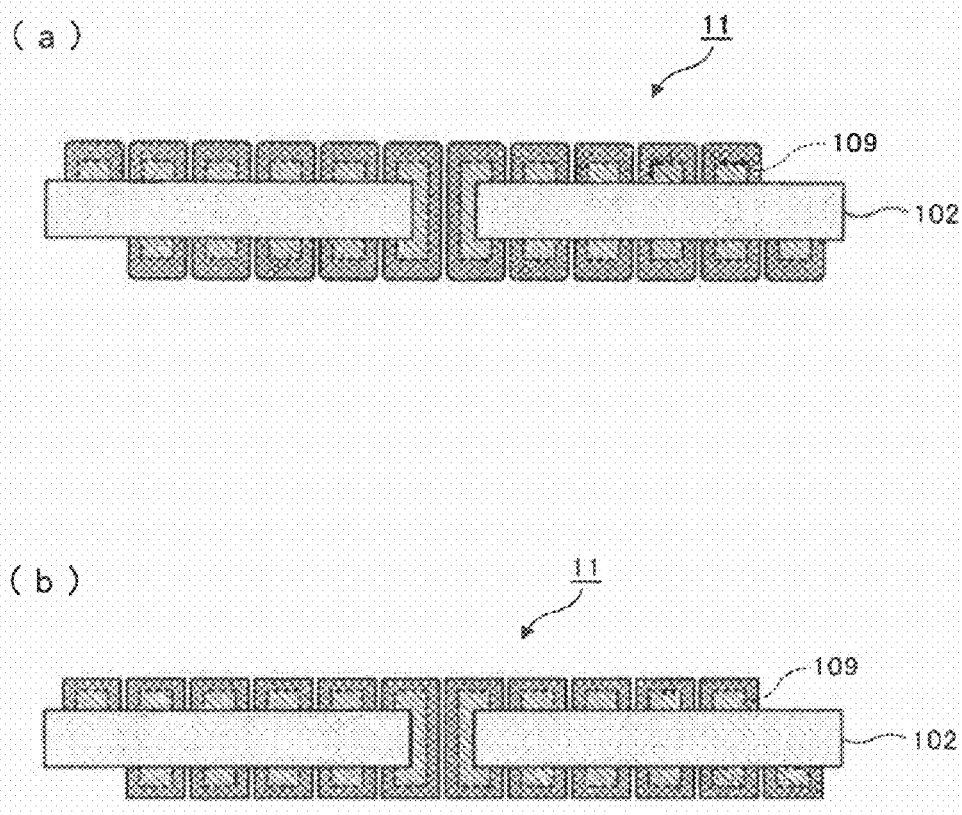
FIG. 13 is an explanatory diagram illustrating the state where a copper plating layer with prescribed thickness was formed on a coil pattern.

FIG. 13 is an explanatory diagram illustrating the state in which a copper plating layer with a prescribed thickness is formed on a coil pattern 109. Repetition of these processes is completed when the copper plating layer with a prescribed thickness is formed on the coil pattern 109 by repeating the process of reconnecting short-circuit wires, the re-plating process, and the process of removing short-circuit wires. FIG. 13(*a*) shows such a state. The coil pattern (conductor pattern) 109 has a cross-section that is about 100 μm long and about 200 μm wide after completing the etching process shown in FIG. 6(*b*), while the cross-section after repeating additional plating has a length of about 250 to 300 μm and a width of 300 to 330 μm.

Then, the surface is polished to planarize the top end surface of each coil pattern 109 (surface polishing process). As shown in FIG. 13(*b*), the cross-section after surface polishing will be about 220 to 270 μm long and 300 to 330 μm wide. After completing the surface polishing, as shown in FIG. 4, the coil sheets 11 are individually separated using a tool such as a cutter or a laser (not shown). As described above, the coil sheet 11 is thus completed.

Thus, in one embodiment, a technique is provided for suppressing variations in plating thickness over an entire conductor circuit (coil pattern). A laminated coil is manufactured via a manufacturing method comprising: a short-circuit wire-connecting process in which a coil pattern 109 is connected by a short-circuit line 110 that includes at least one conductive material so that the entire coil pattern 109 formed on a resin substrate will have the same potential; a plating process in which electrolysis plating is applied to the coil pattern 109 to form a plating layer; and a process of removing short-circuit wires in which the short-circuit wire 110 is removed from the coil pattern 109.

Method of producing the laminated coil: The method of manufacturing the laminated coil 1 using coil sheets 11 that are manufactured via the above-described manufacturing method will be described below.

Figure 14:
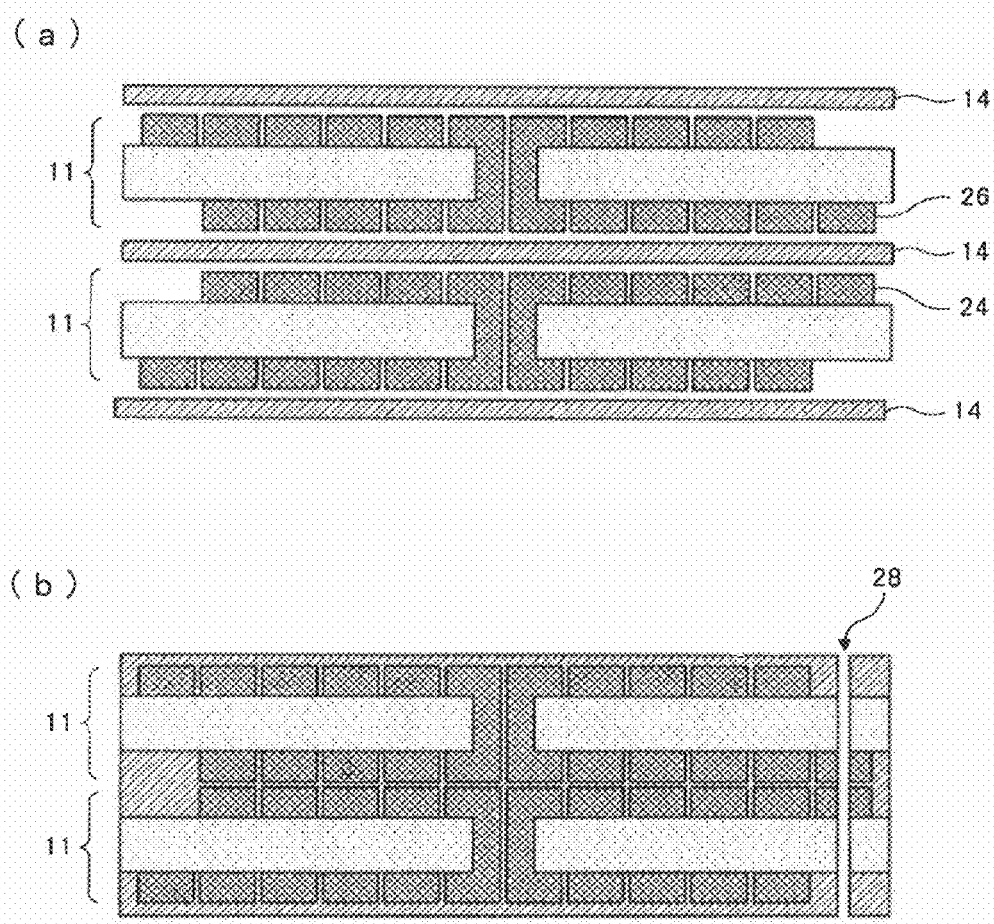
FIG. 14 is explanatory diagram of a process of manufacturing a laminated coil shown in FIG. 1.
Figure 15:
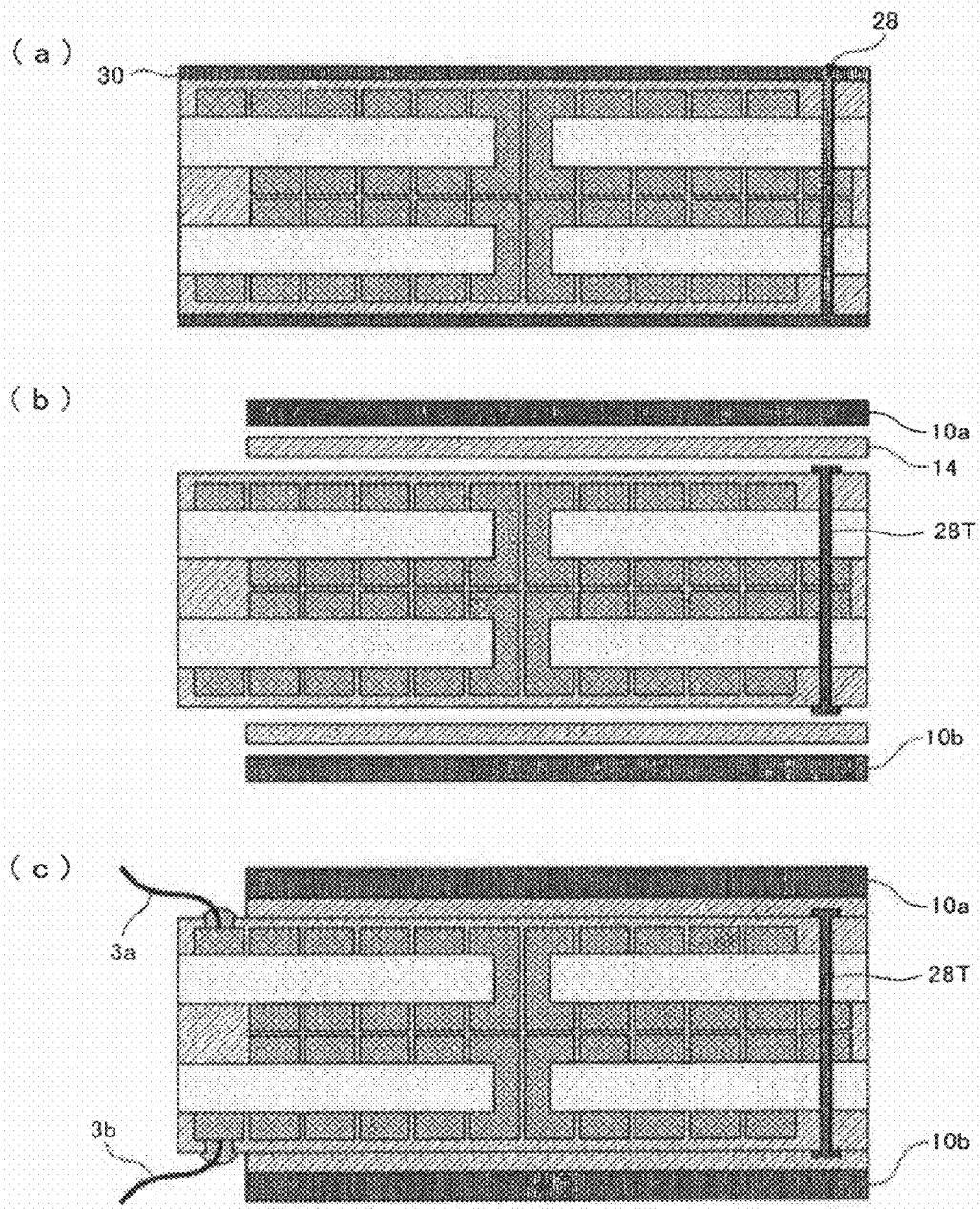
FIG. 15 is explanatory diagram of a process of manufacturing a laminated coil shown in FIG. 1.

FIG. 14 and FIG. 15 are explanatory diagrams of a process of manufacturing the laminated coil 1 shown in FIG. 1. As shown in FIG. 14(*a*), each coil sheet 11 is laminated in the state in which the insulating sheet 14 as an example of an interlayer resin insulating layer is provided between the coil sheets 11 (lamination process). In this process, each coil sheet is aligned so that the connecting terminals 26 and 24 of the coil sheets opposing each other have the same position two-dimensionally, and are then laminated. In other words, in the first embodiment, two coil sheets 11 are laminated by displacing them by 45 degrees in the circumferential direction. However, the insulating sheet 14 is formed by an insulating sheet (including a film) such as a modified epoxy resin sheet, a polyphenylene ether resin sheet, a polyimide sheet, a cyanoester resin sheet, or the like and has a thickness of about 20 to 80 μm. However, the insulating sheet 14 may be formed as an interlayer resin insulating layer, including an inorganic filler or a thermosetting resin in the process of manufacturing the laminated coil 1.

As shown in FIG. 14(*b*), after laminating two coil sheets 11, through-holes 28 are formed at the position of the connecting terminals 26 and 24 (through-hole forming process). Then, as shown in FIG. 15(*a*), a through-hole conductor 28T is formed by plating the inner peripheral surface of the formed through-hole conductor 28 through a non-electrolytic and electrolytic plating process (non-electrolytic plating and electrolytic plating process). Then, an etching resist is coated on the through-hole conductor 28T, and the plating layer other than the through-hole conductor 28T is removed by etching. Thus, the overlapped coil sheets 11 are electrically connected.

As shown in FIG. 15(*b*), the insulating sheet 14 and the radiator plates 10*a* and 10*b* in which the places corresponding to the positions of the connecting terminals 24 and 26 are cut out are laminated on the top surface and the under surface of the laminated coil sheet 11 (discharging plate lamination process).

Then, the connecting cords 3*a* and 3*b* are connected to the connecting terminals 24 and 26 of the outermost coil sheets 11*a* and 11*h* (see FIG. 2), and the laminated coil 1 is thus completed. However, if the insulating sheet 14 covers the surface of the connecting terminals 24 and 26 during the process of laminating the insulating sheet, such an insulating sheet 14 is removed when connecting the connecting cords 3*a* and 3*b*.

Verifying the Effects

Figure 16:
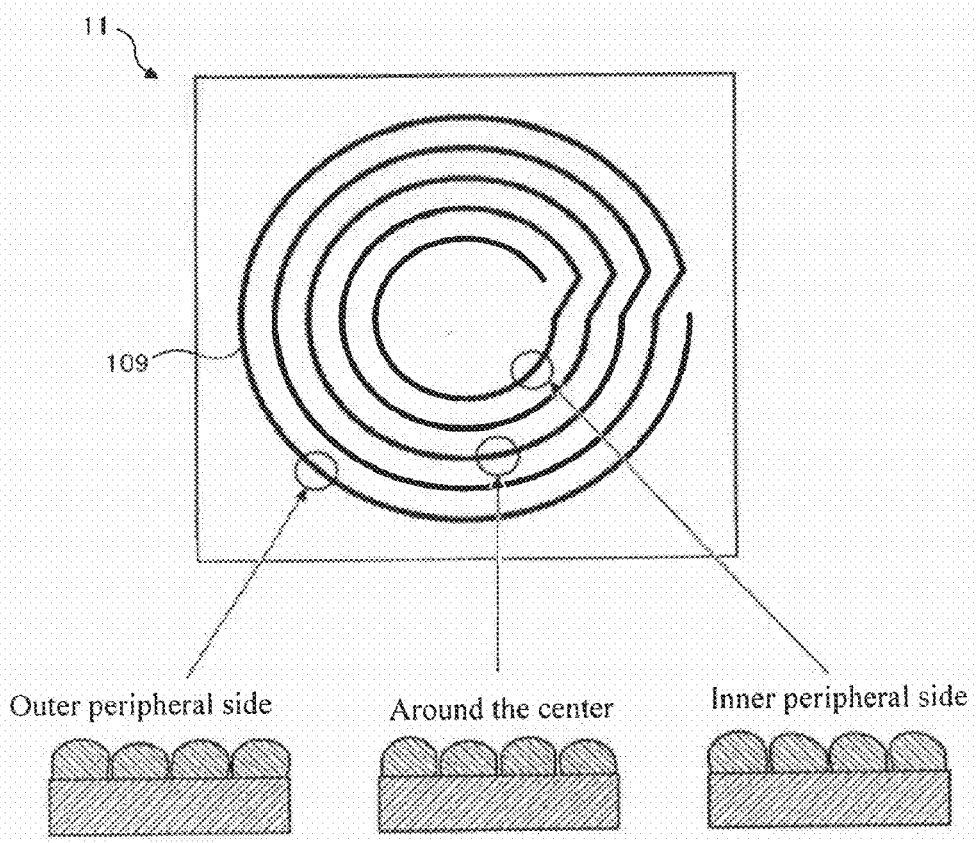
FIG. 16 is a sectional view of a laminated coil shown in FIG. 1.
Figure 17:
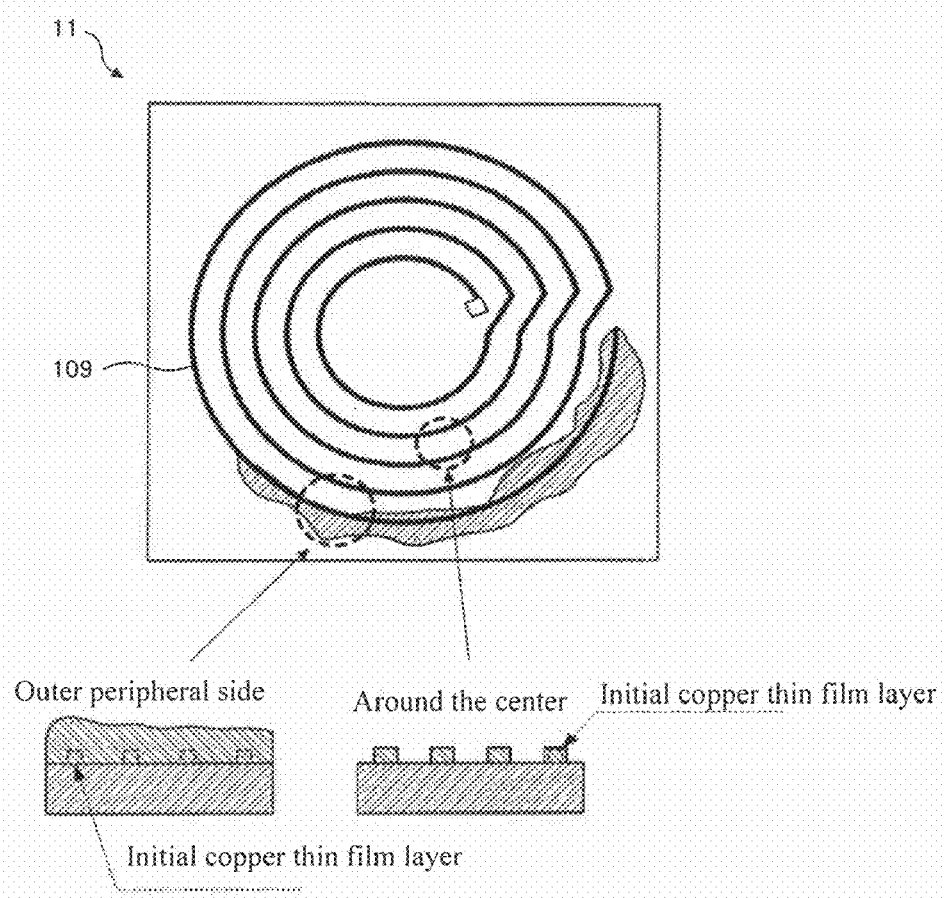
FIG. 17 is a sectional view where a laminated coil is manufactured by a conventional method.

The difference in thickness of the coil pattern 109 in the radial direction was verified in the laminated coil 1 according to the first embodiment. FIG. 16 is a sectional view of the laminated coil 1 shown in FIG. 1 according to the first embodiment, and FIG. 17 is, as a comparative example, a sectional view where the laminated coil 1 is manufactured by a conventional method. Specifically, in the comparative example, a lead wire is connected to the outer peripheral side end of the coil pattern 109 formed on the insulating resin substrate 102, and a potential is applied thereto to carry out plating without using the short-circuit wire 110.

As shown in FIG. 16, the copper plating layer is formed with nearly the same thickness at any place in the vicinity of the outer peripheral side, around the center, and the vicinity of the inner peripheral side of the coil pattern 109. In contrast, as shown in FIG. 17, in the comparative example, the copper plating layer is built up to the degree of being connected to the next coil pattern by filling the groove between the conductor patterns in the vicinity of the outer peripheral side end. The copper plating layer is formed slightly around the center of the coil pattern 109 in the first embodiment. In the comparative example, the plating is concentrated on the place at which the effect of potential drop of applied potential at the time of plating is low (the vicinity of the outer peripheral side end to which the lead wire is connected), and only a thin plating layer is formed on the copper thin film layer. Thus, it is found that the copper plating layer is not formed uniformly throughout the coil pattern 109.

Consequently, it is observed that when the plating process is carried out using the short-circuit wire 110 as described in the first embodiment, the variation in thickness of the copper plating layer formed on the entire coil pattern 109 can be restrained.

According to the method of manufacturing a conductor circuit (coil pattern) according to the first embodiment, the short-circuit wire 110, including the anisotropic conductive rubber 111, is connected so that the adjacent conductor pattern and the conductor pattern with a different number of turns have same potential. A plating layer is formed on the conductor pattern by applying a potential for the plating and providing plating to the conductor pattern. The short-circuit wire 110 is removed from the conductor pattern. Therefore, the variation in thickness of the copper plating layer can be restrained in the conductor circuits (coil pattern) 21 and 22 formed on the coil sheet 11. Therefore, a coil sheet 11 having a high space factor can be provided.

In the process of reconnecting short-circuit wires, a re-plating process is provided by connecting a short-circuit wire to a different place than the place (concave portion) at which the short-circuit wire 110 was connected in the previous process and the plating layer is not formed thereon. Therefore, the thickness of the plating layer of the coil pattern 109 to be formed can be more uniform.

In the plating process, nearly the same potential can be applied to the entire coil pattern 109 via the short-circuit wire 110. Therefore, a plating layer with a more uniform thickness can be formed on the entire coil pattern 109. Furthermore, the short-circuit wire 110 comprises the anisotropic conductive rubber 111 and the lead wire 112. A potential for the plating is applied to the coil pattern 109 while pressing the short-circuit wire 110 thereon with a prescribed pressure. Therefore, the short-circuit wire 110 can be a current-carrying state induced by pressing while plating, and the removal of the short-circuit 110 after completing the plating is easy, so operability can be improved. Because the short-circuit wire 110 can reliably contact the coil pattern 109, a high-quality plating process can be carried out. Anisotropic conductive rubber 111 in which conductive particles 115 are dispersed is not utilized in the plating layer. Therefore, the short-circuit wire 110 can easily be removed in the short-circuit wire removal process.

The short-circuit wire 110 contacts the conductive particles 115 in the anisotropic conductive rubber 111 when it is pressed via the plating lead 112 with a prescribed pressure, and thus, the short-circuit wire 110 will have a current-carrying state. Therefore, only the place on which the short-circuit wire 110 is pressed on the coil pattern 109 will have a current-carrying state. Unnecessary places will not be plated, so high-quality plating can be realized.

In addition, in the abovementioned embodiment, as shown in FIG. 12, the short-circuit wire 110 is reconnected to the place displaced by 90 degrees from the place to which the short-circuit wire 110 was previously connected (shown with a broken line), and the coil sheet 11 on which the copper plating layer is formed is laminated by displacing by 45 degrees. In such a case, the coil sheets opposing each other are displaced and laminated so that the places at which the short-circuit wire 110 is connected do not overlap. Thus, the concave portions can be displaced without overlapping each other, even if the coil sheets 11 are laminated in a state in which some concave portions remain on the place at which the short-circuit wire 110 is connected without polishing the surface for making it into the state shown in FIG. 13(*b*). Accordingly, the adhesion between the coil sheet 111 and the insulating sheet 14 is better than the case in which the front and back surfaces of the coil sheet 11 are flat. Therefore, the heat generated when the current is applied is efficiently radiated to the outside, and the heat radiation characteristics is thus improved.

The coil patterns 109 are formed on both surfaces of the coil sheet 11 in the same winding direction when viewed from the same surface. The coil patterns 109 formed on the both surfaces of the coil sheet 11 are electrically connected via the through-hole conductor 25 formed on the inner peripheral side end of the coil pattern 109. Therefore, the winding number of the coil pattern 109 can be increased on the front and back surfaces of the coil sheet 11, and thus, a space factor can be increased.

In addition, as for the coil sheet 11, the outer peripheral side end of the coil pattern 109 formed on the coil sheet 111 is formed as the connecting terminals 24 and 26 at the position with a prescribed central angle and same radius with respect to the center of the coil pattern 109, and a plurality of coil sheets 111 are serially-connected via the connecting terminals 24 and 26. Therefore, a plurality of coil sheets 11 can be easily laminated.

Furthermore, the coil patterns 109 formed on the opposing surfaces of the two overlapping coil sheets 11 are electrically connected in that the through-holes formed on the outer peripheral side end of the same position from each other form the connecting terminals 24 and 26. Therefore, a laminated coil 1 with a high space factor can be realized by laminating a plurality of coil sheets 11. Furthermore, the two overlapping coil sheets 11 are laminated via the insulating sheet 14. Therefore, short-circuit between the laminated coil sheets 111 can easily be prevented. Furthermore, radiator plates 10*a* and 10*b* are provided on the outermost layer. Therefore, the heat generated in the coil pattern 109 when the current is carried is efficiently radiated to the outside.

Second Embodiment

In the first embodiment, the short-circuit wire 110 comprising the anisotropic conductive rubber 111 and the lead wire 112 is used as a short-circuit wire. In contrast, the second embodiment differs from the first embodiment in that it uses a metallic wire as the short-circuit wire. Here, in the method of manufacturing the coil sheet 11 described in the first embodiment, the short-circuit wire-connecting process, the plating process, and the process of removing short-circuit wires which differ from the first embodiment are mainly described.

In the through-hole forming process, the through-hole 105 is formed, wherein the double-sided copper-clad laminate 101 is used as a starting material. In the thick copper forming process, the non-electrolytic plating and the electrolytic plating are provided, a copper plating layer with a prescribed thickness on the copper foils 103*a* and 103*b* are formed, and the copper thin film layers 105*a* and 105*b* are formed. In the etching resist forming process, the etching resist 108 is formed on the built up copper thin film layers 105*a* and 105*b*. Then, etching is provided in the etching process.

FIG. 18 is an explanatory diagram illustrating a state in which the short-circuit wire 210 is connected to the coil sheet 1. As shown in FIG. 18(*a*), the short-circuit wire 210 is connected to the formed coil pattern 109 (short-circuit wire-connecting process). Specifically, it is the same as the first embodiment in that the short-circuit wire 210 is connected in the form of crossing the inner peripheral side and the outer peripheral side so that all of the coil patterns 109 are connected.

The short-circuit wire 210 consists of a thin wire having good conductivity such as copper (Cu), aluminum (Al), and gold (Au). The short-circuit wire 210 is incorporated into the plating layer. Therefore, it is preferable for the short-circuit wire to be comprised of a metal having the same main component as that of the plating layer, because a difference in electrical resistance due to a difference of metals used can be eliminated. Otherwise, a metal with a low electrical resistance is preferable.

FIG. 19 is an explanatory diagram illustrating the state in which the short-circuit wire 210 is removed from the coil pattern 109. As shown in FIG. 19(a), the short-circuit wire 210 is embedded in the plating layer at the time of completing the plating process. Therefore, the short-circuit wire 210 between the plating layers provided on the coil pattern 109 is cut using, for example, by a drill, laser, or the like and removed (process of removing short-circuit wires). In addition, as shown in FIG. 19(c), because the convex portion is formed on the surface of the coil pattern 109 upon the completion of the plating process, the surface is polished so as to planarize the top end surface of each coil pattern 109 (surface polishing process) (see FIG. 19(b)).

Then, each coil sheet 11 is laminated by providing an insulating sheet 14 between the coil sheets 11 in the same way as in the first embodiment (lamination process). After laminating eight coil sheets 11a to 11h, the through-holes 28 are formed at the positions of the connecting terminals 26 and 24 (through-hole forming process). A plating layer is formed on the inner peripheral surface of the formed through-hole 28 (non-electrolytic plating and electrolytic plating process) and the overlapping coil sheets 11 are electrically connected. The radiator plates 10a and 10b are laminated on the top surface and the under surface of the laminated coil sheet 11 (radiator plate lamination process), and the connecting cords 3a and 3b are connected to the connecting terminals 24 and 26 of the outermost coil sheets 11a and 11h, and thus, the laminated coil 1 is completed.

When the short-circuit wire 210 is composed of a metallic wire, nearly the same potential can be applied to the entire coil pattern 109, and thus, a uniform plating layer can be formed. In this process, the short-circuit wire 210 that protrudes from the coil pattern 109 can easily be removed using laser or the like.

When the short-circuit wire 210 is composed of a metal having the same main component as that of the plating layer, the short-circuit wire 210 has the same level of electrical resistance as the plating layer, so the metallic wire can remain in the coil pattern 109, and thus, operability is improved.

In addition, when the coil sheets 11 are laminated by displacing by 45 degrees, the convex portions thereon will be displaced without overlapping each other, even if the coil sheets 11 are laminated in the state in which some convex potions remain on the short-circuit wire 210 without polishing the surface to render it in the state shown in FIG. 19(b). Accordingly, the adhesion between the coil sheet 11 and the insulating sheet 14 is made better than the case in which the surface of the coil sheets 11 is flat. Therefore, because the heat generated when a current is applied is efficiently radiated to the outside, the heat radiation properties are improved.

However, in the abovementioned first and second embodiments, a description was given as an example of the case in which the short-circuit wires 110 and 210 are used to short-circuit the adjacent places of the conductor pattern, which is long but curved as a coil pattern 109, but the present invention is not limited thereto. For example, a uniform plating layer can also be formed by using a short-circuit wire to short-circuit the adjacent places of another conductor pattern.

Figure 20:
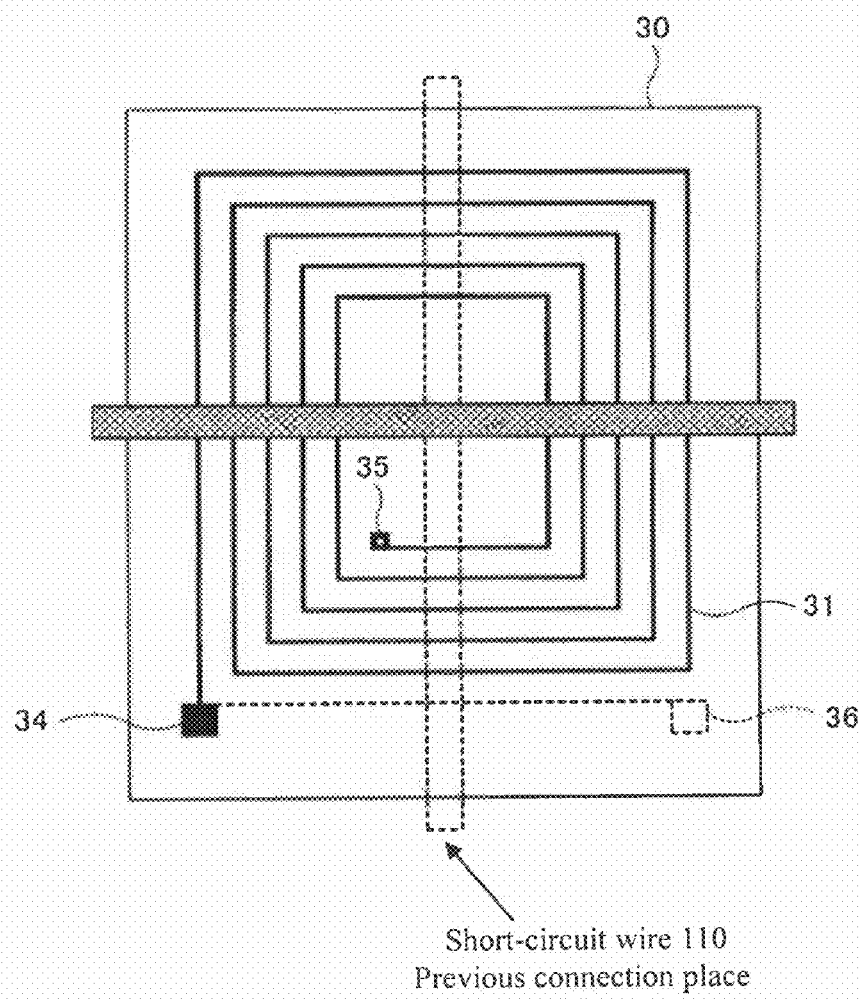
FIG. 20 is a diagram illustrating a coil pattern formed in a rectangular.

In addition, the description was given using the spiral coil pattern 109, but the present invention is not limited thereto. FIG. 20 is a diagram illustrating a coil pattern 31 formed as a rectangle. As shown in FIG. 20, a rectangular coil pattern 30 is formed on a coil sheet 30, a connecting terminal 34 is formed on the outer peripheral side end of the coil pattern 31 (a connecting terminal 36 is formed on the outer peripheral side end on the back surface), and a through-hole conductor 35 is formed on the inner peripheral side end. Even if it is such a coil pattern 31, the entire coil pattern can be kept the same potential using the short-circuit 110, and a uniform plating layer can be formed.

Figure 21:
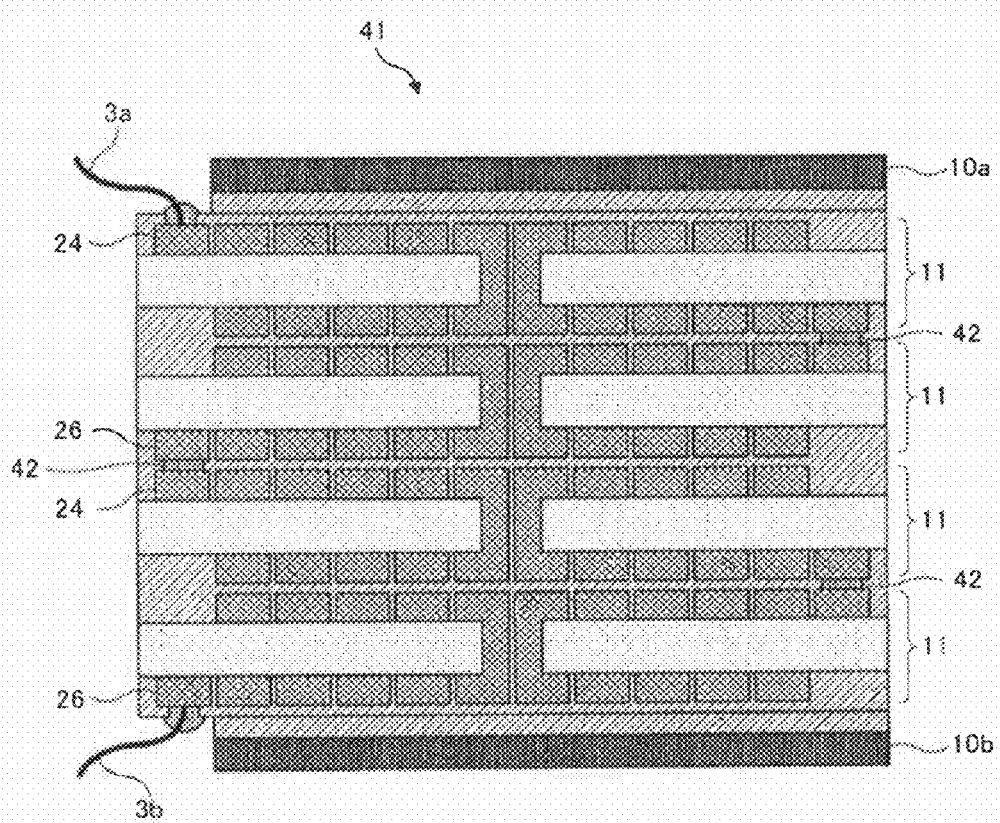
FIG. 21 is a diagram illustrating another connection type of a coil sheet to be laminated.

In the abovementioned first and second embodiments, the description was given as an example for the case in which a plating layer is formed on the inner surface of the through-hole 28 (see FIG. 14(b)) formed on the outer peripheral side end of the coil sheet 11, and the overlapping coil sheets 11 are electrically connected, but the present invention is not limited thereto. FIG. 21 is a diagram illustrating another connection type of coil sheet 11 to be laminated. As shown in FIG. 21, in a laminated coil 41, conductive material 42 is provided on the connecting terminals 24 and 26 formed on the outer peripheral side end of the coil pattern 11. The overlapping coil sheets 11 are electrically connected via the conductive material 42. A conductive paste such as a solder, a conductive rubber, or the like can be used as the conductive material 42, for example. A plurality of coil sheets 11 can easily be connected via the conductive material 42.

Figure 22:
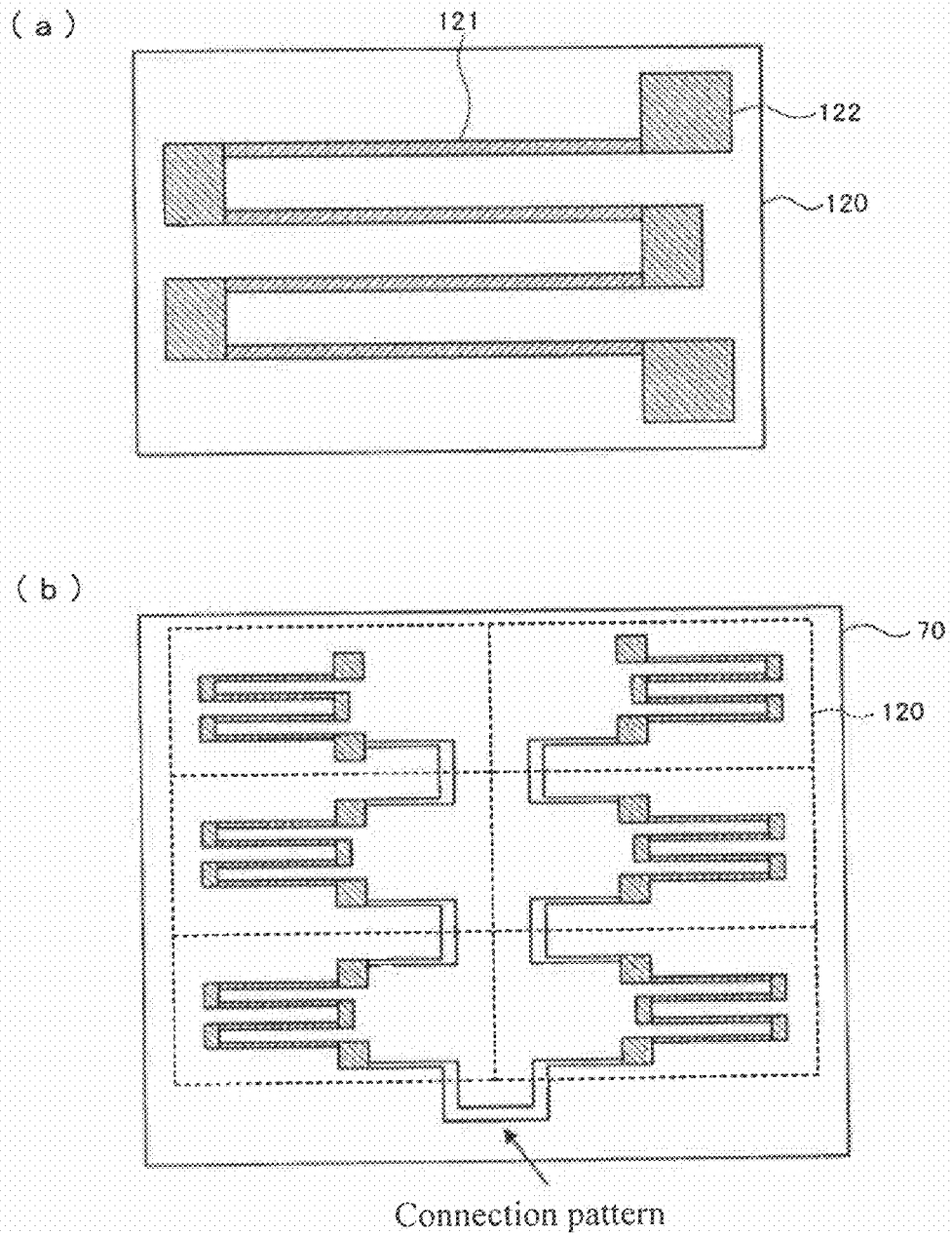
FIG. 22 is a schematic diagram a distortion-detecting element as another example of a conductor pattern.

In the abovementioned first and second embodiments, a coil pattern that is long but curved was described as an example, but the present invention is not limited to this. FIG. 22 is a schematic diagram a distortion-detecting element 120 as another example of a conductor pattern. As shown in FIG. 22(a), the distortion-detecting element 120 comprises four elongated distortion-detecting portions 121 arranged in parallel and a folded connecting portion 122, which is wider than the distortion-detecting portion 121. As shown in FIG. 22(b), processes such as electrolytic plating are carried out in the state of a substrate 70 as an example of a printed wiring board on which the plurality of distortion-detecting elements 120 are arranged lengthwise and crosswise and are serially connected via a connection pattern. A uniform plating layer can be formed by providing electrolytic plating in the state in which the entire distortion-detecting element 120 is kept with the same potential using a short-circuit wire (not shown).

Obviously, numerous modifications and variations of the present invention are possible in light of the above teachings. It is therefore to be understood that within the scope of the appended claims, the invention may be practiced otherwise than as specifically described herein.

The invention claimed is:

1. A method of manufacturing a conductor circuit comprising:
    forming a continuous conductor pattern on an insulating substrate;
    connecting a short-circuit wire at a first position on the continuous conductor pattern such that two or more points on the continuous conductor pattern are short-circuited to each other by the short-circuit wire at the first position;
    forming an electrolytic plating film on the continuous conductor pattern while the short-circuit wire is connected to the continuous conductor pattern at the first position;
    removing the short-circuit wire from the first position on the continuous conductor pattern to uncover a first exposed portion of the of the continuous conductor pattern;

after removing the short-circuit wire from the first position, connecting a short-circuit wire at a second position on the continuous conductor pattern such that two or more different points on the continuous conductor pattern are short-circuited to each other by the short-circuit wire at the second position;

forming an electrolytic plating film on at least part of said first exposed portion of the continuous conductor pattern while the short-circuit wire is connected to the continuous conductor pattern at said second position; and removing the short-circuit wire from the second position on the continuous conductor pattern to uncover a second exposed portion of the of the continuous conductor pattern.

2. The method according to claim 1, wherein said forming an electrolytic plating comprises applying an electrical potential to the continuous conductor pattern via the short-circuit wire.

3. The method according to claim 1, wherein said connecting comprises connecting a short-circuit wire comprising an insulator and a lead wire.

4. The method according to claim 3, wherein said connecting comprises connecting a short-circuit wire comprising an insulator having elasticity and conductive particles dispersed throughout the insulator.

5. The method according to claim 1, wherein said connecting comprises pressing the short-circuit wire on the conductor pattern.

6. The method according to claim 1, wherein:
said connecting comprises connecting a short-circuit wire comprising a metallic wire, and
said removing comprises removing the metallic wire between the two or more points on the conductor portion.

7. The method according to claim 6, wherein the metallic wire comprises metal in the electrolytic plating film.

8. The method according to claim 1, wherein said forming a continuous conductor pattern comprises forming the conductor pattern in a spiral on an insulating substrate.

9. The method according to claim 1, further comprising:
connecting a short-circuit wire at another position on the continuous conductor pattern different from other positions to which a short-circuit wire was previously connected such that two or more other points on the continuous conductor pattern are short-circuited to each other by the short-circuit wire at the another position;

forming an electrolytic plating film on at least part of other exposed portions of the continuous conductor pattern to which a short circuit wire was previously connected and removed, while the short-circuit wire is connected to the continuous conductor pattern at said another position; and removing the short-circuit wire from the another position on the continuous conductor pattern to uncover another exposed portion of the of the continuous conductor pattern.

10. The method according to claim 1, further comprising planarizing the continuous conductor pattern to provide a substantially equal thickness along the entire length of the continuous conductor pattern.

11. The method according to claim 1, further comprising forming the electrolytic plating film on the continuous conductor pattern while plating is repeated by displacing a portion that is in contact with the short-circuit wire comprising an insulator and a lead wire.

* * * * *